US012642023B2

(12) United States Patent
Lin et al.

(10) Patent No.: US 12,642,023 B2
(45) Date of Patent: May 26, 2026

(54) PLASMA ETCHING PROCESSES

(71) Applicant: Taiwan Semiconductor Manufacturing Company, Ltd., Hsinchu (TW)

(72) Inventors: Tzu-Ging Lin, Kaohsiung (TW); Ya-Yi Tsai, Hsinchu (TW); Chun-Liang Lai, Hsinchu (TW); Yun-Chen Wu, Hsinchu (TW); Shu-Yuan Ku, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 249 days.

(21) Appl. No.: 18/349,474

(22) Filed: Jul. 10, 2023

(65) Prior Publication Data

US 2025/0022715 A1      Jan. 16, 2025

(51) Int. Cl.
| | |
|---|---|
| *H10P 50/24* | (2026.01) |
| *H10D 30/01* | (2025.01) |
| *H10D 30/67* | (2025.01) |
| *H10D 62/10* | (2025.01) |
| *H10D 64/01* | (2025.01) |
| *H10W 10/00* | (2026.01) |
| *H10W 10/17* | (2026.01) |
| *H10P 50/00* | (2026.01) |

(52) U.S. Cl.
CPC ......... *H10P 50/244* (2026.01); *H10D 30/014* (2025.01); *H10D 30/6735* (2025.01); *H10D 62/121* (2025.01); *H10D 64/017* (2025.01); *H10W 10/0145* (2026.01); *H10W 10/17* (2026.01); *H10P 50/695* (2026.01)

(58) Field of Classification Search
CPC ......... H01L 21/30655; H01L 21/76232; H01L 21/3086; H01L 21/3065; H01L 21/76224; H10D 30/014; H10D 30/6735; H10D 62/121; H10D 64/017; H10D 84/0151; H10D 84/832; H10D 30/019; H10D 30/501; H10D 84/0153; B82Y 10/00
USPC .......................................................... 438/710
See application file for complete search history.

(56) References Cited

U.S. PATENT DOCUMENTS

| | | | | |
|---|---|---|---|---|
| 2005/0233228 A1* | 10/2005 | Fijol | ...................... | G03G 16/00 |
| | | | | 430/50 |
| 2023/0114191 A1* | 4/2023 | Lu | ...................... | H10D 84/0151 |
| | | | | 438/157 |
| 2024/0088140 A1* | 3/2024 | Sung | ................... | H10D 62/832 |

FOREIGN PATENT DOCUMENTS

WO      WO-2022220224 A1 * 10/2022      ........ H01J 37/32449

* cited by examiner

*Primary Examiner* — Duy Vu N Deo
(74) *Attorney, Agent, or Firm* — Ingrassia Fisher & Lorenz, LLP

(57)      ABSTRACT

Methods for fabricating semiconductor devices are provided. An exemplary method includes forming fins in a dense region and in an isolated region of a semiconductor substrate; performing a plasma dry etch process to remove a portion of at least one selected fin to form a first trench in the dense region and to remove a portion of at least one selected fin in the isolated region to form a second trench in the isolated region, wherein the plasma dry etch process includes: performing a passivation-oriented process and an etchant-oriented process; and controlling the passivation-oriented process and the etchant-oriented process to form the first trench with a desired first critical dimension and first depth and to form the second trench with a desired second critical dimension and second depth.

20 Claims, 23 Drawing Sheets

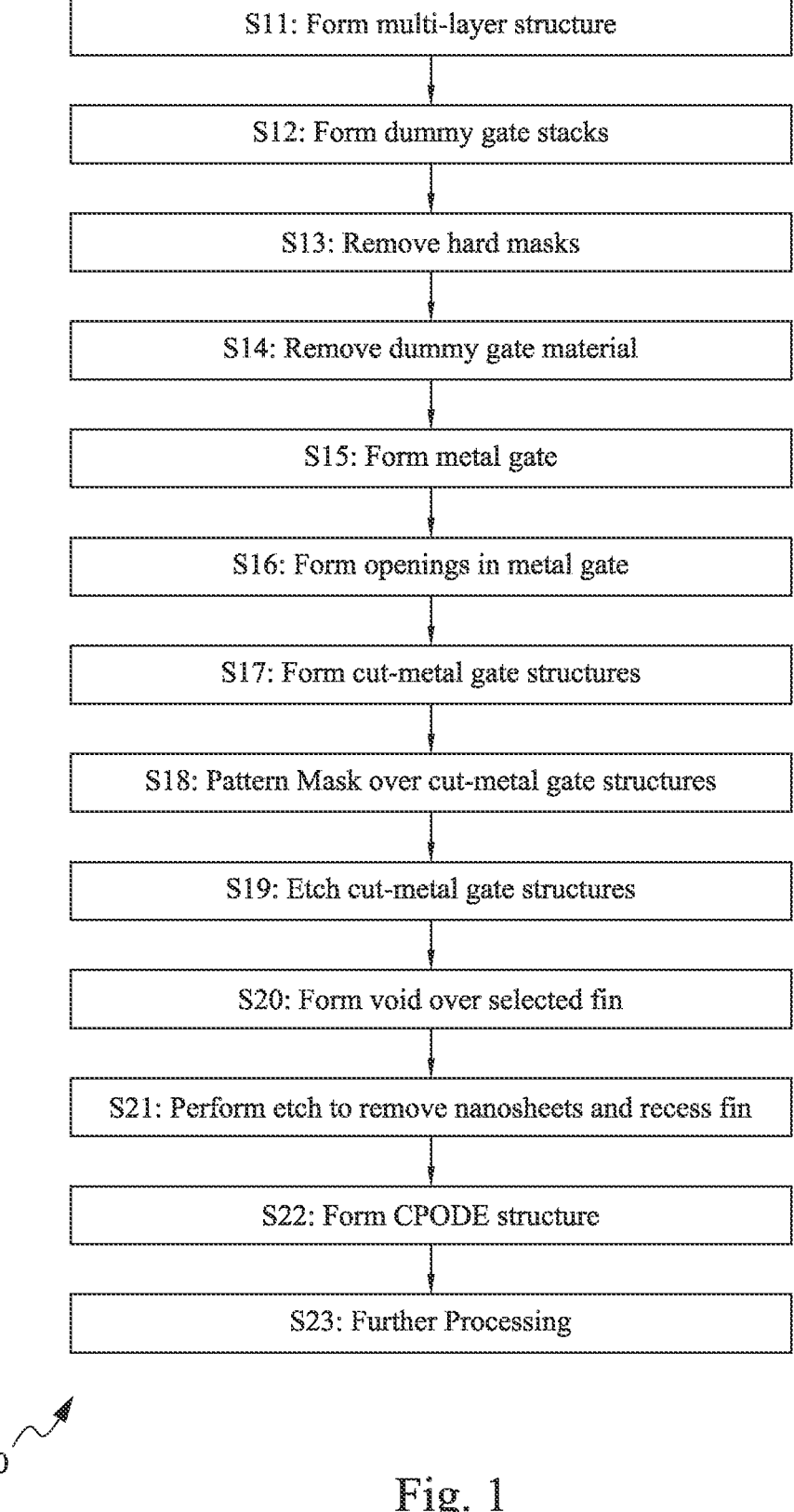

S11: Form multi-layer structure

S12: Form dummy gate stacks

S13: Remove hard masks

S14: Remove dummy gate material

S15: Form metal gate

S16: Form openings in metal gate

S17: Form cut-metal gate structures

S18: Pattern Mask over cut-metal gate structures

S19: Etch cut-metal gate structures

S20: Form void over selected fin

S21: Perform etch to remove nanosheets and recess fin

S22: Form CPODE structure

S23: Further Processing

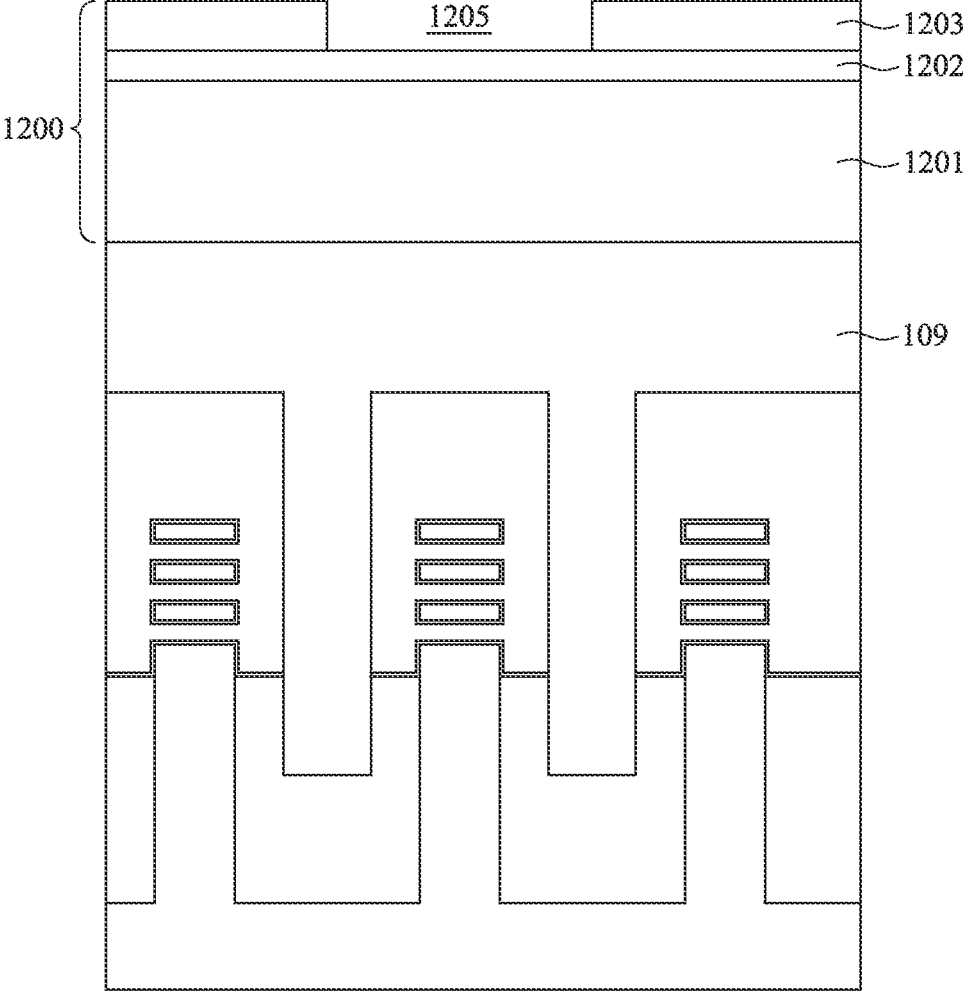
Fig. 10

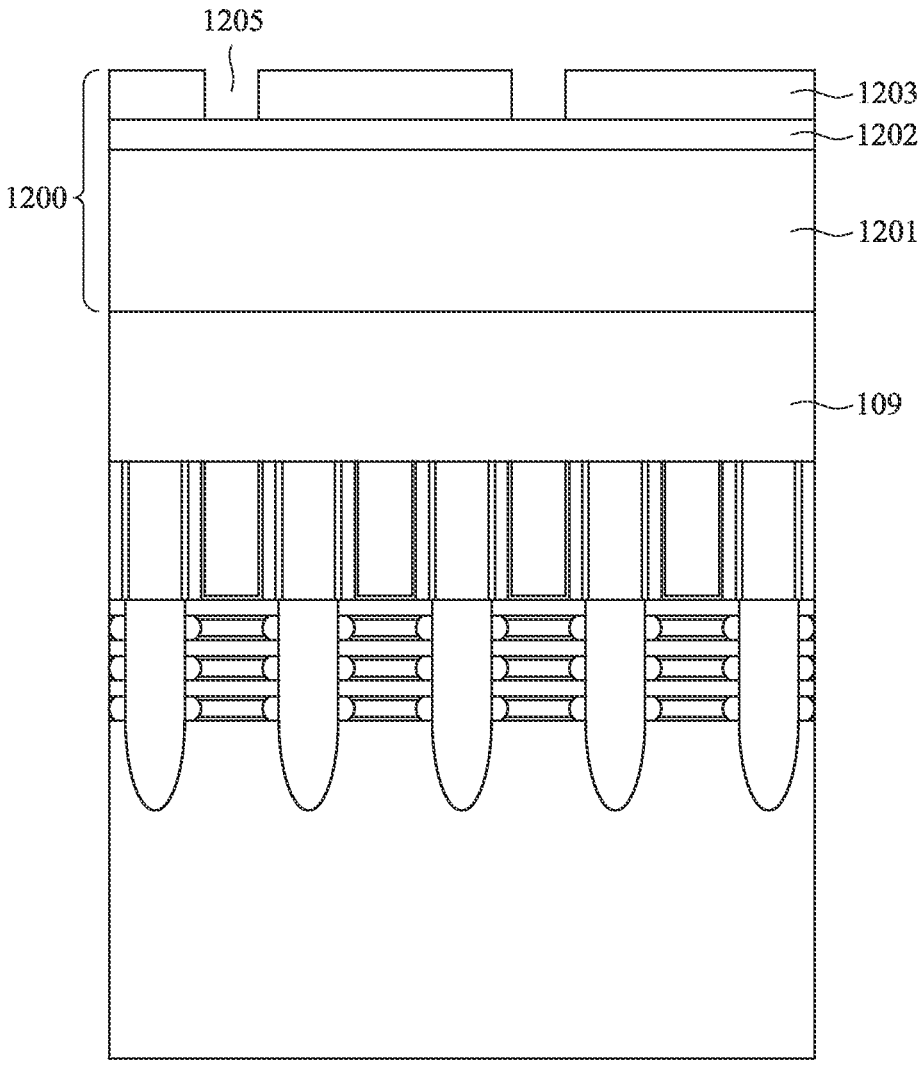
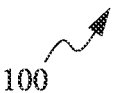
Fig. 11

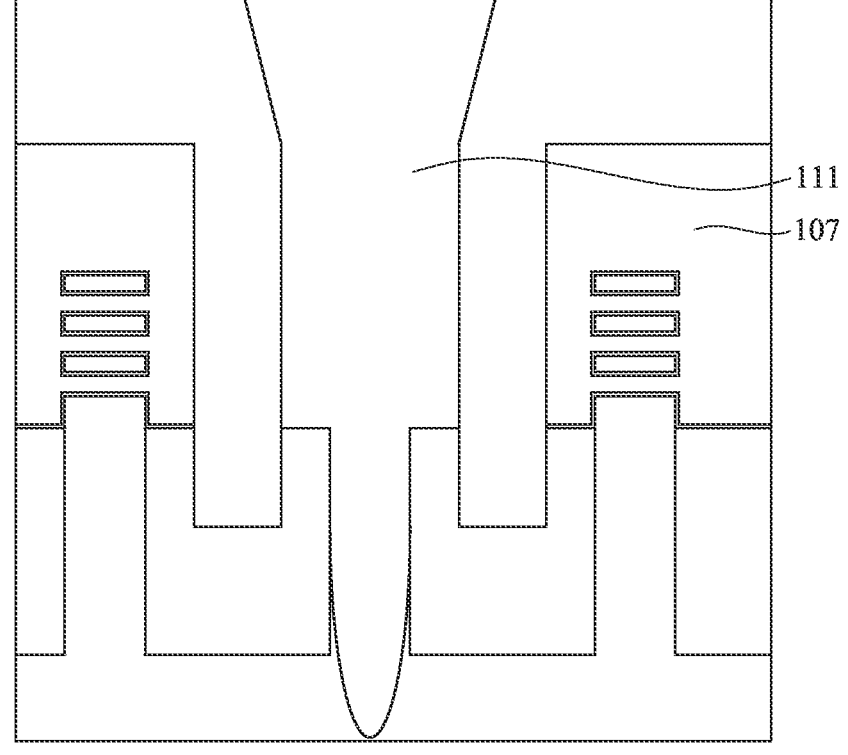
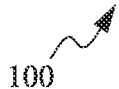
Fig. 18

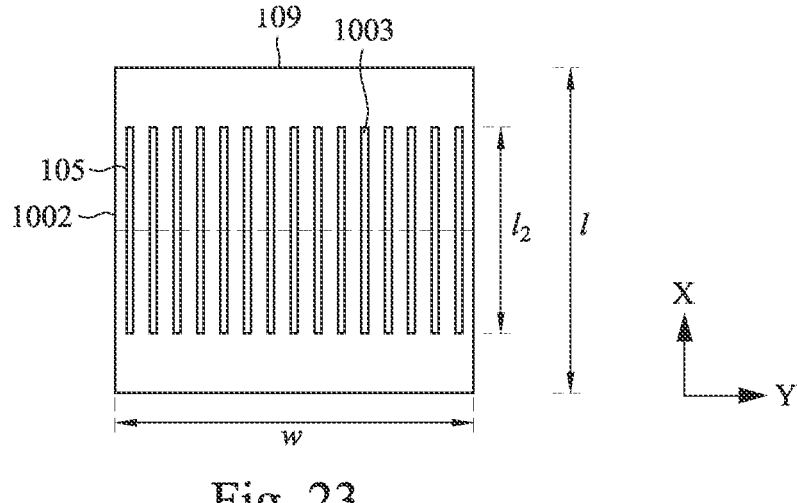
Fig. 23
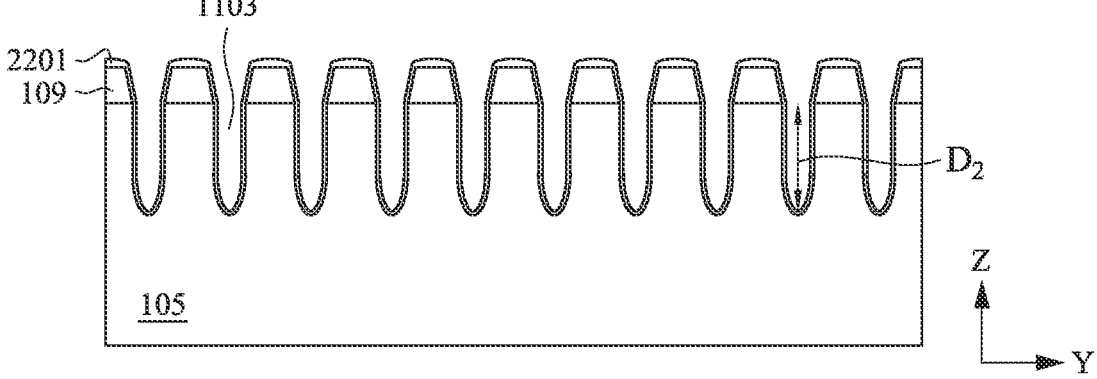
Fig. 24
Fig. 25

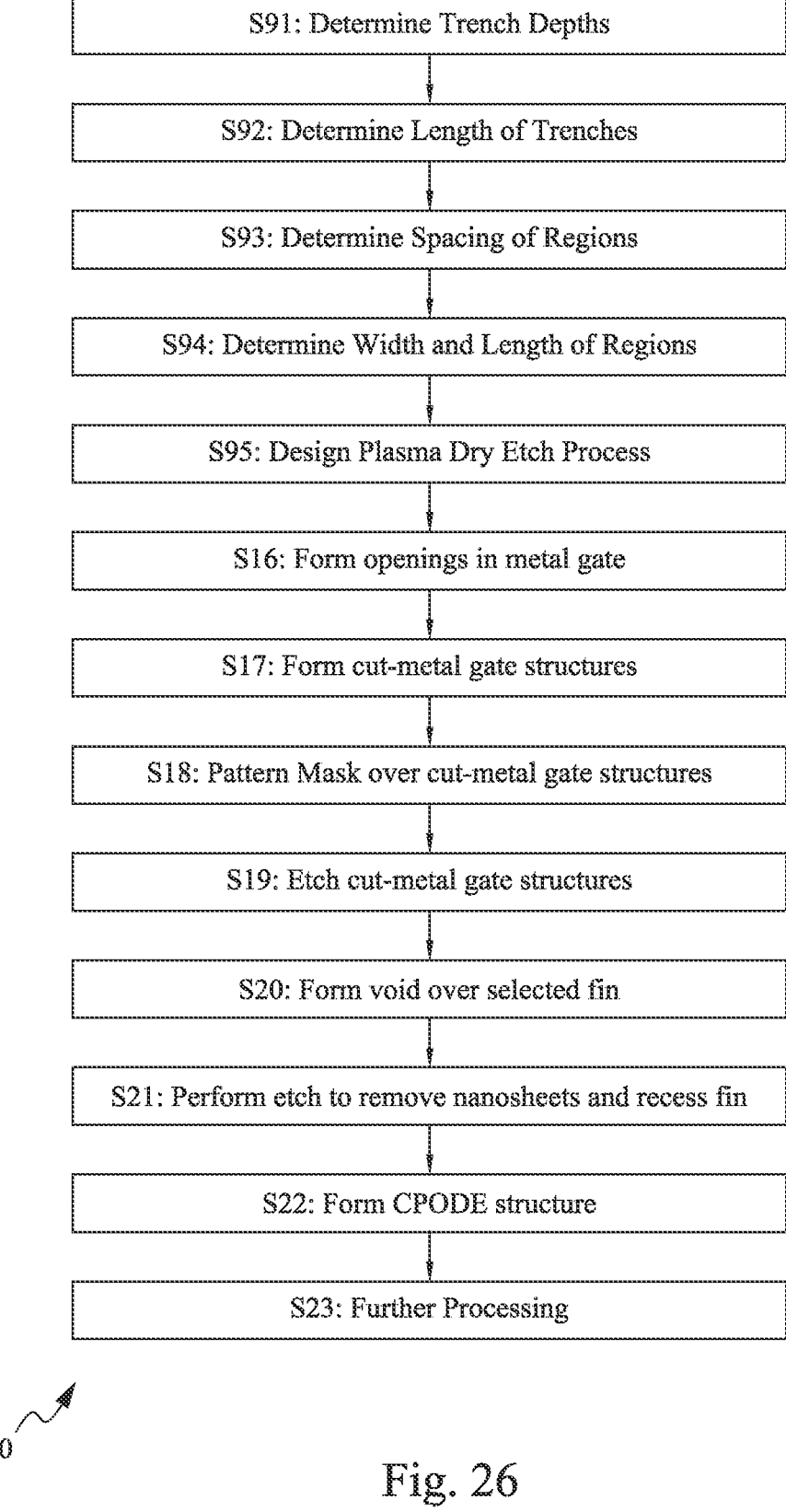

S91: Determine Trench Depths

S92: Determine Length of Trenches

S93: Determine Spacing of Regions

S94: Determine Width and Length of Regions

S95: Design Plasma Dry Etch Process

S16: Form openings in metal gate

S17: Form cut-metal gate structures

S18: Pattern Mask over cut-metal gate structures

S19: Etch cut-metal gate structures

S20: Form void over selected fin

S21: Perform etch to remove nanosheets and recess fin

S22: Form CPODE structure

S23: Further Processing

PLASMA ETCHING PROCESSES

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a flow chart illustrating a method, in accordance with some embodiments.

FIGS. 3-10, 12, 14, 16, and 18 are cross-sectional views of a device, taken along a Y-axis, during successive stages of fabrication of the method of FIG. 1, in accordance with some embodiments.

FIGS. 11, 13, 15, 17, and 19 are cross-sectional views of the device at the fabrication stage of the previous figure, taken along a Y-axis, in accordance with some embodiments.

FIG. 23 is an overhead view of the partially fabricated device of FIG. 14 in a dense region.

FIG. 24 is a cross-section view of the device of FIG. 23 along a Y-axis after a passivation-oriented etching operation.

FIG. 25 is a cross-section view of the device of FIG. 23 along a Y-axis after an etchant-oriented etching operation.

FIG. 26 is a flow chart illustrating a method, in accordance with some embodiments.

DETAILED DESCRIPTION

Figure 2:
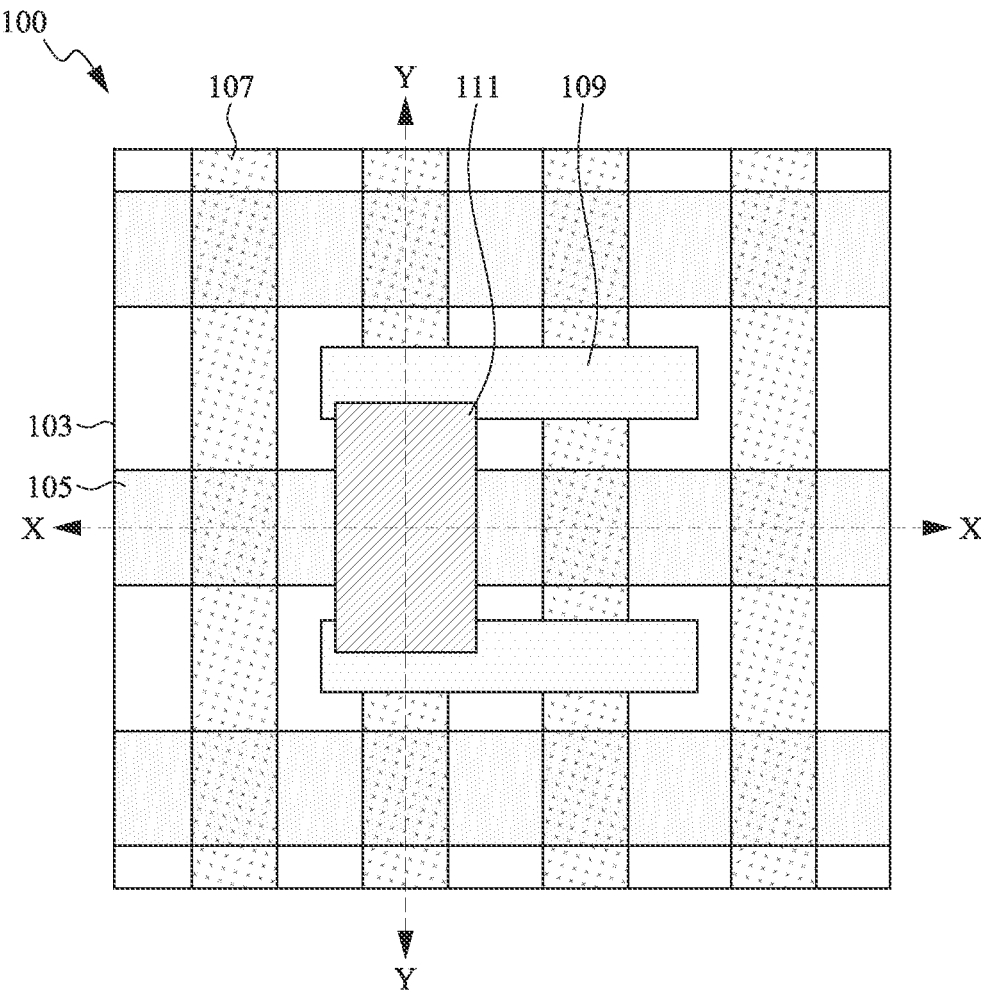
FIG. 2 illustrates a top-down view of a gate-all-around (GAA) semiconductor device, according to some embodiments.

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "over", "overlying", "above", "upper", "top", "under", "underlying", "beneath", "below", "lower", "bottom", "side", and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In certain embodiments herein, a "material structure" is a structure that includes at least 50 wt. % of the identified material, for example at least 60 wt. % of the identified material, at least 75 wt. % of the identified material, at least 90 wt. % of the identified material, at least 95 wt. % of the identified material, or at least 99 wt. % of the identified material; and a structure that is formed of a "material" includes at least 50 wt. % of the identified material, for example at least 60 wt. % of the identified material, at least 75 wt. % of the identified material, at least 90 wt. % of the identified material, at least 95 wt. % of the identified material, or at least 99 wt. % of the identified material. For example, certain embodiments, each of a tungsten structure and a structure formed of tungsten is a structure that is at least 50 wt. %, at least 60 wt. %, at least 75 wt. %, at least 90 wt. %, at least 95 wt. %, or at least 99 wt. % of tungsten.

For the sake of brevity, typical techniques related to semiconductor device fabrication may not be described in detail herein. Moreover, the various tasks and processes described herein may be incorporated into a more comprehensive procedure or process having additional functionality not described in detail herein. In particular, various processes in the fabrication of semiconductor devices are well-known and so, in the interest of brevity, many typical processes will only be mentioned briefly herein or will be omitted entirely without providing the well-known process details. As will be readily apparent to those skilled in the art upon a complete reading of the disclosure, the structures disclosed herein may be employed with a variety of technologies, and may be incorporated into a variety of semiconductor devices and products. Further, it is noted that semiconductor device structures include a varying number of components and that single components shown in the illustrations may be representative of multiple components.

Presented herein are embodiments of semiconductor devices and of methods for fabricating such devices. Methods described herein may be easily integrated into the current process flow. Further, methods described herein relate to the formation of an insulation structure, such as a Continuous Poly On Diffusion Edge (CPODE) structure, that divides a fin in two. In certain embodiments, a portion of a selected fin structure is removed and replaced with insulation material.

In embodiments herein, a CPODE-last processing method, i.e., during middle-end-of-line (MEOL) processing after metal gate formation is described. However, embodiments are not so limited and may be utilized in a CPODE-first processing methods, i.e., during front-end-of-line (FEOL) processing before metal gate formation.

In embodiments herein, CPODE processes are used to pattern transistors utilizing plasma etching to avoid leakage current through transistors and silicon substrates. Further, embodiments herein mitigate against isolated/dense depth loading and provide tuning knobs for isolated/dense depth loading. Also, in embodiments herein the CPODE etch achieves sufficiently deep vertical depth and small lateral width or critical dimension (CD) to avoid leakage and damage to epitaxial source/drain regions, respectively. As used herein, "source/drain region(s)" may refer to a source region or a drain region, individually or collectively depending on the context.

Embodiments of the present disclosure offer advantages over the existing art, though it is understood that other embodiments may offer different advantages, not all advantages are necessarily discussed herein, and no particular advantage is required for all embodiments.

For purposes of the discussion that follows, FIG. 1 provides a flow chart for a method 10 for fabricating a semiconductor device 100 during a semiconductor fabrication process. Method 10 is described below with reference to FIGS. 2-19 which illustrate the semiconductor device 100 at various stages of fabrication according to method 10. FIG. 2 illustrates a top-down view of an intermediate structure in forming a device 100, such as a gate-all-around (GAA) semiconductor device, according to some embodiments. FIGS. 3-10, 12, 14, 16, and 18 are cross-sectional views in which the vertical direction is defined by the Z-axis and the lateral direction is defined by the Y-axis, i.e., "Y-cuts". FIGS. 11, 13, 15, 17, and 19 are cross-sectional views in which the vertical direction is defined by the Z-axis and the lateral direction is defined by the X-axis, i.e., "X-cuts". It is understood that method 10 includes steps having features of a complementary metal-oxide-semiconductor (CMOS) technology process flow and thus, are only described briefly herein. Also, additional steps may be performed before, after, and/or during method 10.

In FIG. 2, the device 100 includes a multi-layer structure 103 comprising a plurality of nanosheets formed over a semiconductor substrate 201 (illustrated in the following figures), fins 105 formed in the multi-layer structure 103, and a plurality of gate electrodes 107 over the fins 105. FIG. 2 further illustrates a plurality of cut-metal gate structures 109 separating two of the gate electrodes 107 and a Continuous Poly On Diffusion Edge (CPODE) structure 111 dividing one of the fins 105 in two and intersecting the cut-metal gate structures 109.

Although three fins 105 are illustrated in FIG. 2 and in the following Y-cut figures, it is understood that depending on the desired design and number of the GAA semiconductor devices 100, any suitable number of fins 105 may be formed in the multi-layer structure 103 to form the desired GAA semiconductor devices 100. Furthermore, any suitable number of gate electrodes 107, CPODE structures 111, and cut-metal gate structures 109 may be formed to form the desired GAA semiconductor devices 100.

In FIG. 2, the X-axis extends through the length of the fin 105 and passes through the CPODE structure 111. Further, the Y-axis extends through the length of a gate electrode 107 that has been separated by the two cut-metal gate structures 109, through the two cut-metal gate structures 109, and through the CPODE structure 111 intersecting the two cut-metal gate structures 109.

Figure 3:
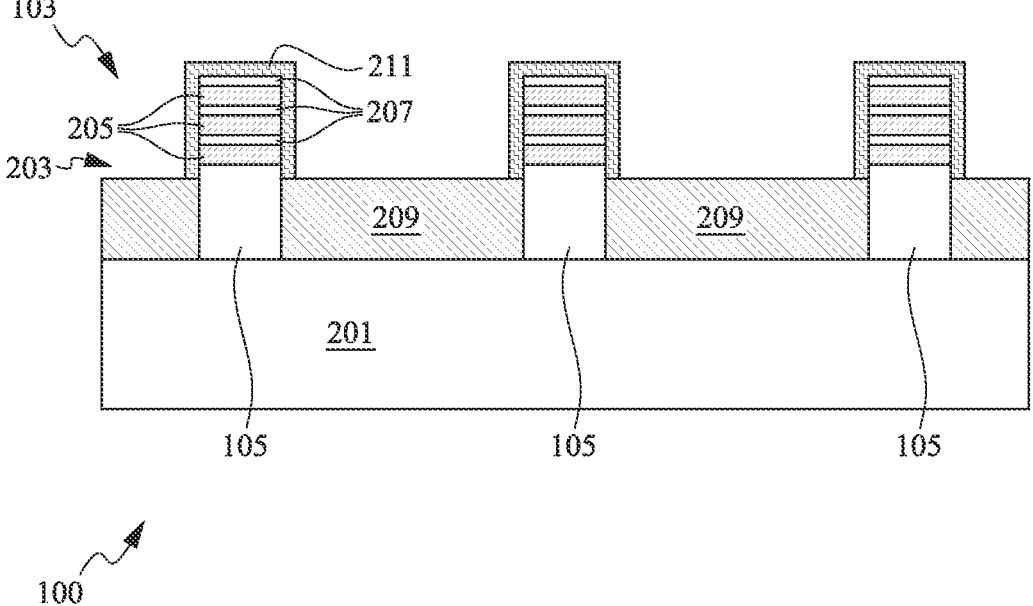

Referring now to FIGS. 1 and 3, a method 10 for fabricating a semiconductor device 100 includes, at S11, forming a multi-layer structure 103 over a semiconductor material, such as a substrate, and forming fin structures 105 in the multi-layer structure 103, in accordance with some embodiments.

In an embodiment the substrate 201 is a semiconductor substrate, which may be, for example, a silicon substrate, a silicon germanium substrate, a germanium substrate, a III-V material substrate (e.g., GaAs, GaP, GaAsP, AlInAs, AlGaAs, GaInAs, InAs, GaInP, InP, InSb, and/or GaInAsP; or a combination thereof), or a substrate formed of other semiconductor materials with, for example, high band-to-band tunneling (BTBT). The substrate 201 may be doped or un-doped. In some embodiments, the substrate 201 may be a bulk semiconductor substrate, such as a bulk silicon substrate that is a wafer, a semiconductor-on-insulator (SOI) substrate, a multi-layered or gradient substrate, or the like.

FIG. 3 illustrates a deposition process to form the multi-layer structure 103 in an intermediate stage of manufacturing the GAA semiconductor device 100, according to some embodiments. In particular, FIG. 3 further illustrates a series of depositions that are performed to form a multi-layer stack 203 of alternating materials of first layers 205 and second layers 207 over the substrate 201.

According to some embodiments, the first layers 205 may be formed using a first semiconductor material with a first lattice constant, such as SiGe, Ge, Si, GaAs, InSb, GaSb, InAlAs, InGaAs, GaSbP, GaAsSb, combinations of these, or the like. In some embodiments, a first layer 205 of the first semiconductor material (e.g., SiGe) is epitaxially grown on the substrate 201 using a deposition technique such as epitaxial growth, vapor-phase epitaxy (VPE), molecular beam epitaxy (MBE), although other deposition processes, such as chemical vapor deposition (CVD), low pressure CVD (LPCVD), atomic layer CVD (ALCVD), ultrahigh vacuum CVD (UHVCVD), reduced pressure CVD (RPCVD), a combination thereof, or the like, may also be utilized. In some embodiments, the first layer 205 is formed to thicknesses of from about 3 nm and about 10 nm. However, any suitable thickness may be utilized while remaining within the scope of the embodiments.

After the first layer 205 has been formed over the substrate 201, a second layer 207 may be formed over the first layer 205. According to some embodiments, the second layers 207 may be formed using a second semiconductor material such as Si, SiGe, Ge, GaAs, InSb, GaSb, InAlAs, InGaAs, GaSbP, GaAsSb, combinations of these, or the like with a second lattice constant that is different from the first lattice constant of the first layer 205. In a particular embodiment in which the first layer 205 is silicon germanium, the second layer 207 is a material such as silicon. However, any suitable combination of materials may be utilized for the first layers 205 and the second layers 207.

In some embodiments, the second layer 207 is epitaxially grown on the first layer 205 using a deposition technique similar to that used to form the first layer 205. However, the second layer 207 may use any of the deposition techniques suitable for forming the first layer 205, as set forth above or any other suitable technique. According to some embodiments, the second layer 207 is formed to a similar thickness to that of the first layer 205. However, the second layer 207 may also be formed to a thickness that is different from the first layer 205. According to some embodiments, the second layer 207 may be formed to a thickness of from about 5 nm and about 15 nm. However, any suitable thickness may be used.

After forming the second layer 207 over the first layer 205, the deposition process is repeated to form the remaining material layers in the series of alternating materials of the first layers 205 and the second layers 207 until a desired topmost layer of the multi-layer stack 203 has been formed. According to the present embodiment, the first layers 205 may be formed to a same or similar first thickness and the second layers 207 may be formed to the same or similar second thickness. However, the first layers 205 may have different thicknesses from one another and/or the second layers 207 may have different thicknesses from one another and any combination of thicknesses may be used for the first layers 205 and the second layers 207. According to the present embodiment, the topmost layer of the multi-layer stack 203 is formed as a second layer 207; however, in other embodiments, the topmost layer of the multi-layer stack 203 may be formed as a first layer 205. Additionally, although embodiments are disclosed herein comprising three of the first layers 205 and three of the second layers 207, the multi-layer stack 203 may have any suitable number of layers (e.g., nanosheets). For example, the multi-layer stack 203 may comprise from two to ten nanosheets. In some embodiments, the multi-layer stack 203 may comprise equal numbers of the first layers 205 to the second layers 207; however, in other embodiments, the number of the first layers 205 may be different from the number of the second layers 207. According to some embodiments, the multi-layer stack 203 may be formed to a height of from about 12 nm to about 100 nm. However, any suitable height may be used.

FIG. 3 further illustrates a patterning process of the multi-layer structure 103 and a formation of isolation regions 209 in an intermediate stage of manufacturing the GAA semiconductor device 100, in accordance with some embodiments. The patterning process is used to form fins 105 in the multi-layer structure 103 and to form trenches between the fins 105 in preparation for forming the isolation regions 209. The patterning process for forming the fins 105, according to some embodiments, comprises applying a photoresist over the multi-layer stack 203 and then patterning and developing the photoresist to form a mask over the multi-layer stack 203. After being formed, the mask is then used during an etching process, such as an anisotropic etching process to transfer the pattern of the mask into the underlying layers to form the trenches through the multi-layer stack 203 and into the substrate 201 to define the fins 105, wherein the fins 105 are separated by the trenches.

Additionally, while a single mask process has been described, this is intended to be illustrative and is not intended to be limiting, as the gate all around (GAA) device structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

In an exemplary embodiment, the isolation regions 209 are formed as shallow trench isolation regions by depositing a dielectric material in the trenches. According to some embodiments, the dielectric material used to form the isolation regions 209 may be a material such as an oxide material (e.g., a flowable oxide), high-density plasma (HDP) oxide, or the like. The dielectric material may be formed, after an optional cleaning and lining of the trenches, using either a chemical vapor deposition (CVD) method (e.g., the HARP process), a high density plasma CVD method, or other suitable method of formation to fill or overfill the regions around the fins 105. In some embodiments, a post placement anneal process (e.g., oxide densification) is performed to densify the material of the isolation regions 209 and to reduce its wet etch rate. A chemical mechanical polishing (CMP), an etch, a combination of these, or the like may be performed to remove any excess material of the isolation regions 209.

After the dielectric material has been deposited to fill or overfill the regions around the fins 105, the dielectric material may then be recessed away from the surface of the fins 105 to form the isolation regions 209. The recessing may be performed to expose at least a portion of the sidewalls of the fins 105 adjacent to the top surface of the fins 105. The dielectric material may be recessed using a wet etch by dipping the top surface of the fins 105 into an etchant selective to the material of the dielectric material, although other methods, such as a reactive ion etch, a dry etch, chemical oxide removal, or dry chemical clean may be used.

FIG. 3 further illustrates the formation of a dummy gate dielectric 211 over the exposed portions of the fins 105. After the isolation regions 209 have been formed, the dummy gate dielectric 211 may be formed by thermal oxidation, chemical vapor deposition, sputtering, or any other methods known and used in the art for forming a gate dielectric. Depending on the technique of gate dielectric formation, the dummy gate dielectric 211 thickness on the top may be different from the dummy dielectric thickness on the sidewall. In some embodiments, the dummy gate dielectric 211 may be formed by depositing a material such as silicon and then oxidizing or nitridizing the silicon layer in order to form a dielectric such as the silicon dioxide or silicon oxynitride. In such embodiments, the dummy gate dielectric 211 may be formed to a thickness of from about 3 Å to about 100 Å, such as about 10 Å. In other embodiments, the dummy gate dielectric 211 may also be formed from a high permittivity (high-k) material such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of from about 0.5 Å to about 100 Å, such as about 10 Å or less. Additionally, any combination of silicon dioxide, silicon oxynitride, and/or high-k materials may also be used for the dummy gate dielectric 211.

Figure 4:
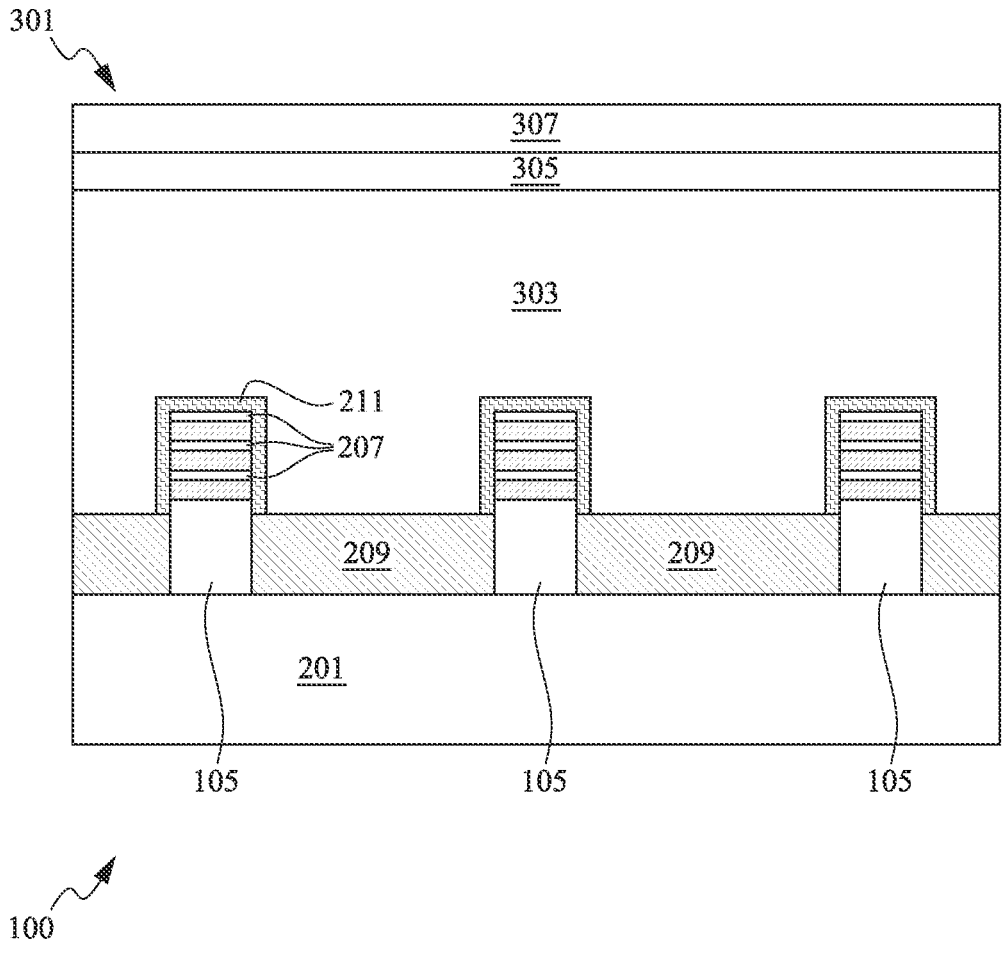

Cross-referencing FIGS. 1 and 4, method 10 may continue, at 512, forming sacrificial or dummy gate stacks 301 over the fins 105, in accordance with some embodiments. According to some embodiments, the dummy gate stacks 301 comprise a dummy gate dielectric 211, a dummy gate electrode 303 over the dummy gate dielectric 211, a first hard mask 305 over the dummy gate electrode 303, and a second hard mask 307 over the first hard mask 305.

In some embodiments, the dummy gate electrode 303 comprises a conductive material and may be selected from a group comprising of polysilicon, W, Al, Cu, AlCu, W, Ti, TiAlN, TaC, TaCN, TaSiN, Mn, Zr, TiN, Ta, TaN, Co, Ni, combinations of these, or the like. The dummy gate electrode 303 may be deposited by chemical vapor deposition (CVD), sputter deposition, or other techniques known and used in the art for depositing conductive materials. The thickness of the dummy gate electrode 303 may be from about 5 Å to about 500 Å. The top surface of the dummy gate electrode 303 may have a non-planar top surface, and may be planarized prior to patterning of the dummy gate electrode 303 or gate etch. Ions may or may not be introduced into the dummy gate electrode 303 at this point. Ions may be introduced, for example, by ion implantation techniques.

After the dummy gate electrode 303 has been formed, the dummy gate dielectric 211 and the dummy gate electrode 303 may be patterned. In an embodiment the patterning may be performed by initially forming a first hard mask 305 over the dummy gate electrode 303 and forming the second hard mask 307 over the first hard mask 305.

According to some embodiments, the first hard mask 305 comprises a dielectric material such as silicon nitride (SiN), oxide (OX), silicon oxide (SiO), titanium nitride (TiN), silicon oxynitride (SiON), combinations of these, or the like. The first hard mask 305 may be formed using a process such as chemical vapor deposition, plasma enhanced chemical vapor deposition, atomic layer deposition, or the like. However, any other suitable material and method of formation may be utilized. The first hard mask 305 may be formed to a thickness of from about 20 Å to about 3000 Å, such as about 20 Å.

The second hard mask 307 comprises a separate dielectric material from the material of the first hard mask 305. The second hard mask 307 may comprise any of the materials and use any of the processes suitable for forming the first hard mask 305 and may be formed to a same or similar thickness as the first hard mask 305. In embodiments where the first hard mask 305 comprises silicon nitride (SiN), the second hard mask 307 may be e.g., an oxide (OX). However, any suitable dielectric materials, processes and thicknesses may be used to form the second hard mask.

After the first hard mask 305 and the second hard mask 307 have been formed, the first hard mask 305 and the second hard mask 307 may be patterned. Patterning of the first hard mask 305 and second hard mask 307 occurs in the X-dimension, i.e., distanced into or out of the drawing sheet for the cross-sectional views of FIGS. 3-12. Thereafter, various processes may be performed to form desired structures, etching of the dummy gate material to form distinct dummy gate stacks, formation of spacers, etching of openings for source/drain regions, epitaxial growth of source/drain regions, implant processes, and other typical gate processing.

Figure 5:
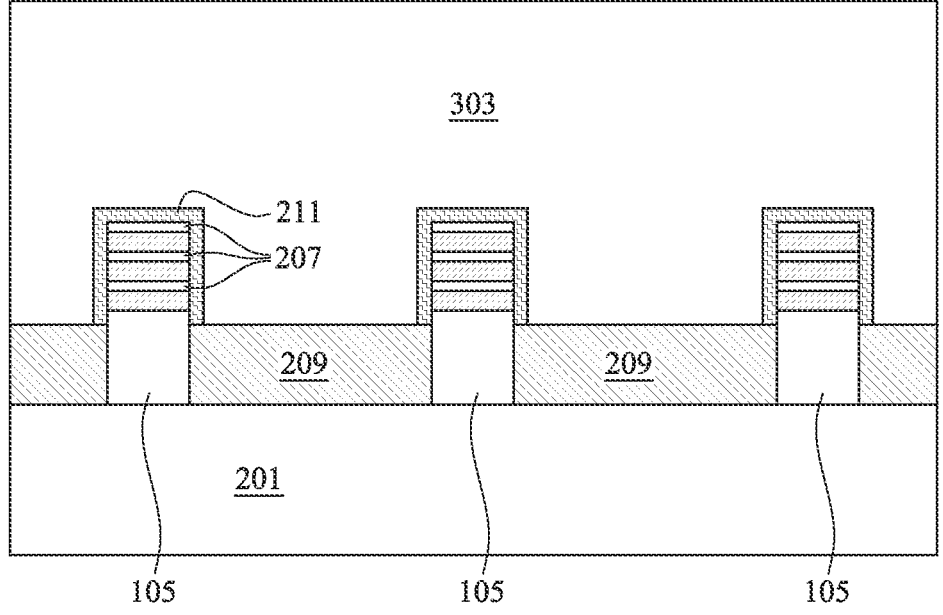

Cross-referencing FIGS. 1 and 5, method 10 may continue, at S13, with removal of the first hard mask 305 and the second hard mask 307. According to some embodiments, one or more etching processes and/or the chemical mechanical planarization (CMP) may be utilized to remove the first hard mask 305 and the second hard mask 307. As such, the dummy gate electrode 303 is exposed after the removal of the first hard mask 305.

Figure 6:
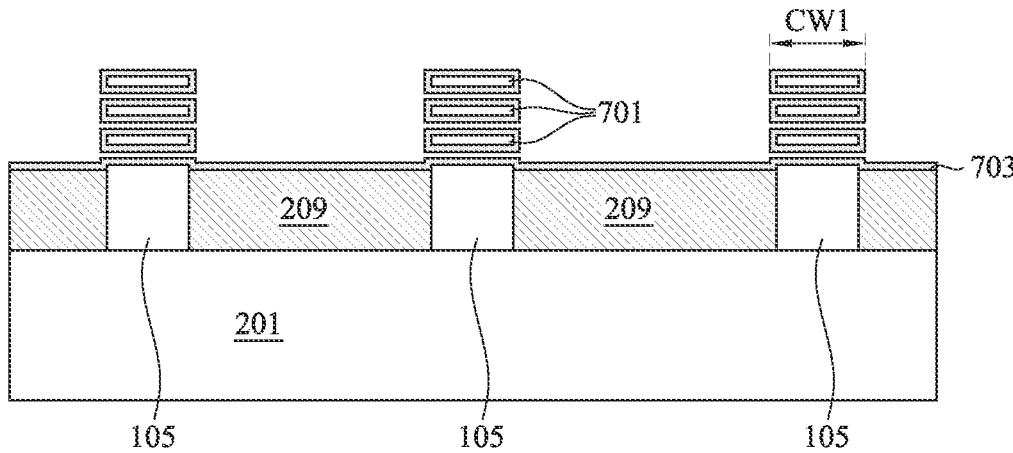

Cross-referencing FIGS. 1 and 6, method 10 may continue, at S14, with removing the dummy gate electrode 303 and the dummy gate dielectric 211. FIG. 6 further illustrates a wire-release process to form nanostructures 701, i.e., vertically-spaced nanosheets, from the second layers 207, in accordance with some embodiments. FIG. 6 further illustrate the formation of a gate dielectric 703 over the nanostructures 701, according to some embodiments.

After being exposed by removal of the first hard mask 305, the dummy gate electrode 303 may be removed in order to expose the underlying dummy gate dielectric 211. In an embodiment the dummy gate electrode 303 is removed using, e.g., one or more wet or dry etching process that utilizes etchants that are selective to the material of the dummy gate electrode 303. However, any suitable removal process may be utilized.

After the dummy gate dielectric 211 has been exposed by removal of the dummy gate electrode 303, the dummy gate dielectric 211 may be removed. In an embodiment the dummy gate dielectric 211 may be removed using, e.g., a wet etching process, although any suitable etching process may be utilized.

After the dummy gate dielectric 211 has been removed (which also exposes the sides of the first layers 205), the first layers 205 may be removed from between the substrate 201 and from between the second layers 207 in a wire release process step. The wire release process step may also be referred to as a sheet release process step, a sheet formation process step, a nanosheet formation process step or a wire formation process step. In an embodiment the first layers 205 may be removed using a wet etching process that selectively removes the material of the first layers 205 (e.g., silicon germanium (SiGe)) without significantly removing the material of the substrate 201 and the material of the second layers 207 (e.g., silicon (Si)). However, any suitable removal process may be utilized.

For example, in an embodiment, an etchant such as a high temperature HCl may be used to selectively remove the material of the first layers 205 (e.g., SiGe) without substantively removing the material of the substrate 201 and/or the material of the second layers 207 (e.g., Si). Additionally, the wet etching process may be performed at a temperature of from 400° C. to about 600° C., such as about 560° C., and for a time of from about 100 seconds to about 600 seconds, such as about 300 seconds. However, any suitable etchant, process parameters, and time can be utilized.

By removing the material of the first layers 205, the sides of the second layers 207 (relabeled nanostructures 701 in FIG. 6) are exposed. According to some embodiments, the nanostructures 701 are vertically separated or spaced from one another by a spacing of from about 5 nm to about 15 nm, such as about 10 nm. The nanostructures 701 comprise the channel regions between opposite ones of the source/drain regions and have a channel length (in the X-direction into and out of the drawing sheet) of from about 5 nm to about 180 nm, such as about 10 nm, and a channel width CW1, in the Y-direction, of from about 8 nm to about 100 nm, such as about 30 nm. In an embodiment the nanostructures 701 are formed to have the same thicknesses as the original thicknesses of the second layers 207 such as from about 3 nm to about 15 nm, such as about 8 nm, although the etching processes may also be utilized to reduce the thicknesses.

In some embodiments, the wire release step may include an optional step for the partial removal of the material of the second layers 207 (e.g., by over etching) during removal of the first layers 205. As such, the thicknesses of the nanostructures 701 are formed to have reduced thicknesses as compared to the original thickness of the second layers 207. As such, the nanostructures 701 may have thicknesses that are less than the thicknesses of the original second layers 207.

Although FIG. 6 illustrates the formation of three of the nanostructures 701, any suitable number of the nanostructures 701 may be formed from the nanosheets provided in the multi-layer stack 203. For example, the multi-layer stack 203 may be formed to include any suitable number of the first layers 205 and any suitable number of the second layers 207. As such, a multi-layer stack 203 comprising fewer first layers 205 and fewer second layers 207, after removal of the first layers 205, forms one or two of the nanostructures 701. Whereas, a multi-layer stack 203 comprising many of the first layers 205 and many of the second layers 207, after removal of the first layers 205, forms four or more of the nanostructures 701.

FIG. 6 further illustrates the formation of the gate dielectric 703 over the nanostructures 701, according to some embodiments. In an embodiment the gate dielectric 703 comprises a high-k material (e.g., K greater than or equal to 9) such as $Ta_2O_5$, $Al_2O_3$, Hf oxides, Ta oxides, Ti oxides, Zr oxides, Al oxides, La oxides (e.g., $HfO_2$, HfSiO, HfSiON, HfTaO, HfTiO, HfZrO, LaO, ZrO, TiO), combinations of these, or the like, deposited through a process such as atomic layer deposition, chemical vapor deposition, or the like. In some embodiments, the gate dielectric 703 comprises a nitrogen doped oxide dielectric that is initially formed prior to forming a metal content high-K (e.g., K value>13) dielectric material. The gate dielectric 703 may be deposited to a thickness of from about 1 nm to about 3 nm, although any suitable material and thickness may be utilized. In exemplary embodiments, the gate dielectric 703 wraps around the nanostructures 701, thus forming channel regions between the source/drain regions.

Figure 7:
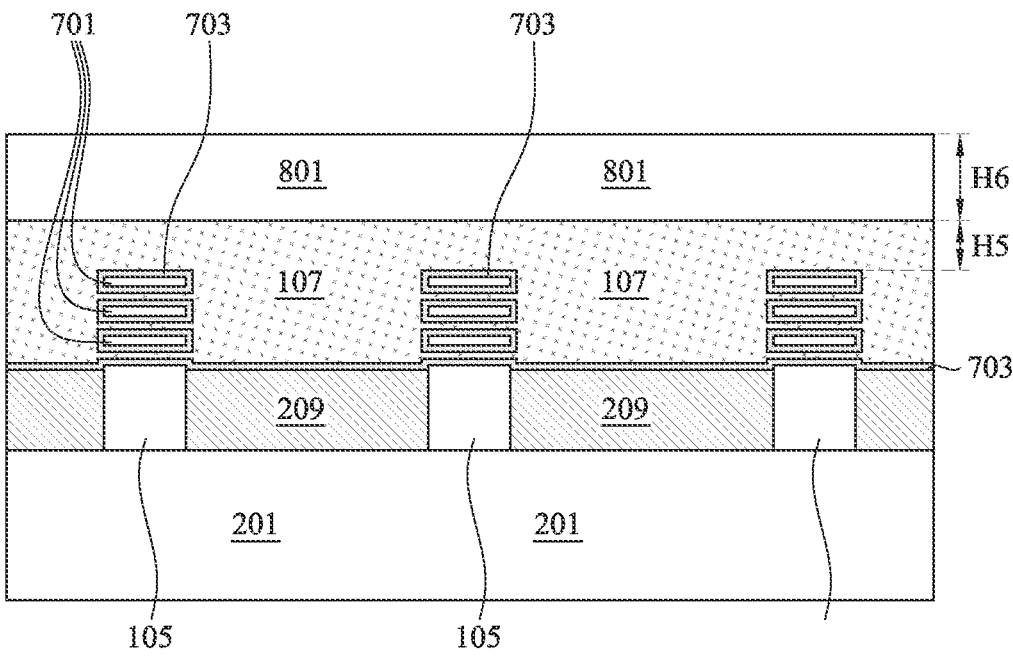

Cross-referencing FIGS. 1 and 7, method 10 may continue, at S15, with forming a metal gate over the fin structures. For example, method 10 includes forming gate electrodes 107 and gate caps 801, in accordance with some embodiments. After the gate dielectric 703 has been formed, the gate electrodes 107 are formed to surround the nanostructures 701. For example, inter-sheet portions of the metal gate are located between the nanosheets 701.

In some embodiments, the gate electrodes 107 are formed using multiple layers, each layer deposited sequentially adjacent to each other using a highly conformal deposition process such as atomic layer deposition, although any suitable deposition process may be utilized. According to some embodiments, the gate electrodes 107 may comprise a capping layer, a barrier layer, an n-metal work function layer, a p-metal work function layer, and a fill material.

The capping layer may be formed adjacent to the gate dielectric 703 and may be formed from a metallic material such as TaN, Ti, TiAlN, TiAl, Pt, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The metallic material may be deposited using a deposition process such as atomic layer deposition, chemical vapor deposition, or the like, although any suitable deposition process may be used.

The barrier layer may be formed adjacent the capping layer, and may be formed of a material different from the capping layer. For example, the barrier layer may be formed of a material such as one or more layers of a metallic material such as TiN, TaN, Ti, TiAlN, TiAl, Pt, TaC, TaCN, TaSiN, Mn, Zr, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The barrier layer may be deposited using a deposition process such as atomic layer deposition, chemical vapor deposition, or the like, although any suitable deposition process may be used.

The n-metal work function layer may be formed adjacent to the barrier layer. In an embodiment the n-metal work function layer is a material such as W, Cu, AlCu, TiAlC, TiAlN, TiAl, Pt, Ti, TiN, Ta, TaN, Co, Ni, Ag, Al, TaAl, TaAlC, TaC, TaCN, TaSiN, Mn, Zr, other suitable n-type work function materials, or combinations thereof. For example, the first n-metal work function layer may be deposited utilizing an atomic layer deposition (ALD) process, CVD process, or the like. However, any suitable materials and processes may be utilized to form the n-metal work function layer.

The p-metal work function layer may be formed adjacent to the n-metal work function layer. In an embodiment, the first p-metal work function layer may be formed from a metallic material such as W, Al, Cu, TiN, Ti, TiAlN, TiAl, Pt, Ta, TaN, Co, Ni, TaC, TaCN, TaSiN, $TaSi_2$, $NiSi_2$, Mn, Zr, $ZrSi_2$, TaN, Ru, AlCu, Mo, $MoSi_2$, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the p-metal work function layer may be deposited using a deposition process such as atomic layer deposition, chemical vapor deposition, or the like, although any suitable deposition process may be used.

After the p-metal work function layer has been formed, the fill material is deposited to fill a remainder of the opening. In an embodiment the fill material may be a material such as tungsten, Al, Cu, AlCu, W, Ti, TiAlN, TiAl, Pt, TaC, TaCN, TaSiN, Mn, Zr, TiN, Ta, TaN, Co, Ni, combinations of these, or the like, and may be formed using a deposition process such as plating, chemical vapor deposition, atomic layer deposition, physical vapor deposition, combinations of these, or the like. However, any suitable material may be utilized.

After the openings left behind by the removal of the dummy gate electrode 303 have been filled, the materials of the gate electrode 107 and the gate dielectric 703 may be planarized in order to remove any material that is outside of the openings left behind by the removal of the dummy gate electrode 303. In a particular embodiment the removal may be performed using a planarization process such as chemical mechanical polishing, although any suitable planarization and removal process may be utilized. According to some embodiments, the gate electrodes may be formed to a length of from about 8 nm to about 30 nm. However, any suitable length may be used.

After being formed, the gate electrodes 107 may be recessed. According to some embodiments, the gate electrodes 107 may be recessed using an etching process such as a wet etch, a dry etch, combinations, or the like. After being recessed, the height of the gate electrodes 107 above a topmost one of the nanostructure 701 is a height H5, such as from about 8 nm to about 30 nm. However, any suitable height may be used.

The gate caps 801 may be formed by initially depositing a dielectric material over the gate electrodes 107 to fill and/or overfill the recesses. In some embodiments, the gate caps 801 are formed using a dielectric material such as a silicon nitride (SiN), oxide (OX), silicon oxynitride (SiON), silicon oxycarbonitride (SiOCN), silicon carbonitride (SiCN), or the like. According to some embodiments, the gate caps 801 are formed using a metal oxide of materials such as zirconium (Zr), hafnium (Hf), aluminum (Al), or the like. Furthermore, the gate caps 801 may be formed using a suitable deposition process such as chemical vapor deposition (CVD), atomic layer deposition (ALD), physical vapor deposition (PVD), combinations of these, or the like. However, any suitable materials and deposition processes may be utilized. After being deposited, the gate caps 801 may be planarized using a planarization process such as a chemical mechanical polishing process. After being planarized, the gate caps 801 have a sixth height H6 of from about 10 nm to about 30 nm. However, any suitable height may be used.

Figure 8:
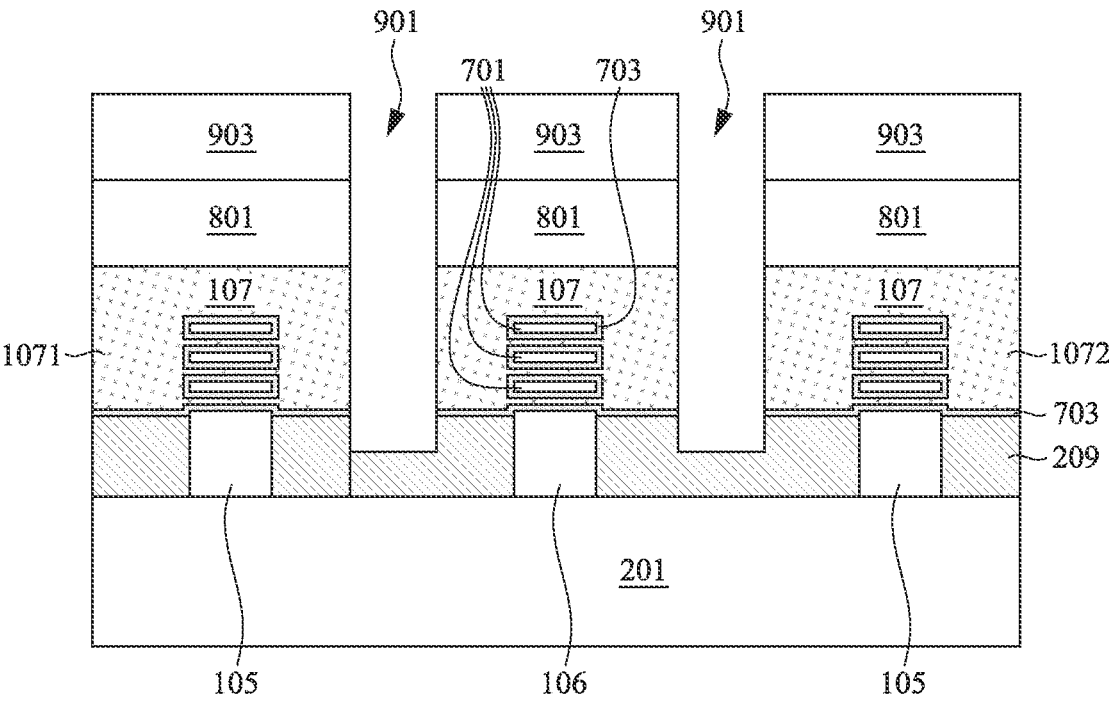

Cross-referencing FIGS. 1 and 8, method 10 may continue, at S16, with forming openings 901 in a cut-metal gate process, in accordance with some embodiments. After the gate caps 801 have been planarized, a masking layer 903 may be deposited over the planar surfaces of the gate caps 801. After being deposited, the masking layer 903 is patterned to expose the underlying materials including the gate caps 801 in desired locations of the cut-metal gate structures 109 that are to be formed.

After being patterned, the masking layer 903 is used as an etching mask to etch the underlying materials to form the openings 901 (e.g., trenches, recesses, channels or the like). In the etching process, the materials of the gate caps 801 and the gate electrodes 107 are etched using an anisotropic etching process. In exemplary embodiments, the etch process continues through the gate dielectric 703 and into the isolation regions 209. The openings 901 may be formed between adjacent fins 105 and may be formed to cut through one or more gate electrodes 107. According to some embodiments, two of the openings 901 are formed to cut through two adjacent gate electrodes 107 and are located on opposite sides of one of the fins 105, e.g., a selected fin 106, as shown in FIG. 1. After the openings 901 have been formed, the masking layer 903 is removed.

Figure 9:
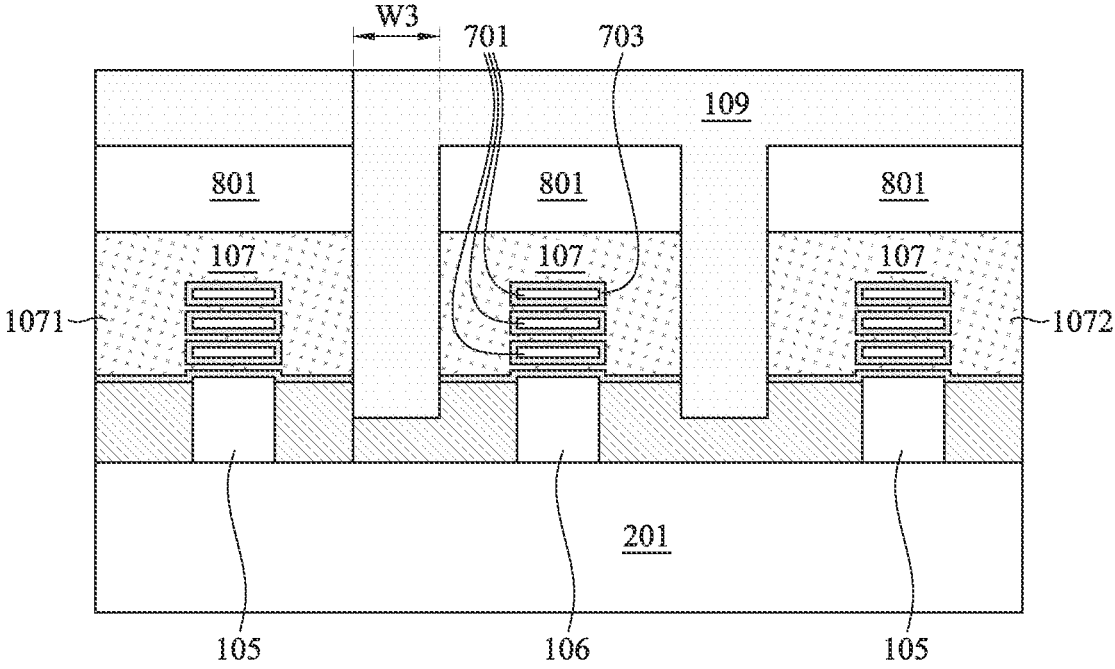

Cross-referencing FIGS. 1 and 9, method 10 may continue, at S17, with forming cut-metal gate structures 109, in accordance with some embodiments. After the openings 901 have been formed, the cut-metal gate structures 109 are formed by initially depositing a dielectric material to fill and overfill the openings 901. In accordance with some embodiments, the cut-metal gate structures 109 are formed using any dielectric material and deposition process suitable for forming the gate caps 801. In some embodiments, the dielectric material used to form the cut-metal gate structures 109 is the same as the dielectric material used to form the gate caps 801, although the dielectric materials may be different. For example, in embodiments where the gate caps 801 are formed using silicon nitride (SiN), the cut-metal gate structures 109 may also be formed using silicon nitride (SiN) in a deposition process such as Atomic Layer Deposition (ALD). However, any suitable dielectric materials and deposition processes may be used. For example, the cut-metal gate structures 109 may be formed as layers of SiN and Si. According to some embodiments, the cut-metal gate structures 109 are formed to a width W3 of from about 5 nm to about 50 nm, such as about 10 nm. However, any suitable widths may be used.

The cut-metal gate structures 109 divide the two gate electrodes 107, which are relatively long, into a plurality of segmented gate electrodes 107 which are relatively short and isolate the segmented gate electrodes 107 from one another. Furthermore, the excess dielectric material of the cut-metal gate structures 109 outside of the openings 901 may be retained and used as a masking layer in the Continuous Poly On Diffusion Edge (CPODE) process.

Cross-referencing FIG. 1 and FIGS. 10-11, method 10 may continue with an initial step of forming a Continuous Poly On Diffusion Edge (CPODE) structure 111, in accordance with some embodiments. The CPODE structure 111 may also be referred to herein as an isolation structure, a cut-poly structure or a cut-PODE structure and is discussed in greater detail with the following figures. It is noted that the gate cap 801 is shown as being merged with cut-metal gate structure 109, as both may be considered to be a hard mask. At S18, method 10 patterns a mask 1200 over the partially fabricated device 100 of FIG. 9.

As shown, the mask 1200 may include multiple layers, such as a bottom layer 1201, a middle layer 1202, and a top layer 1203. In some embodiments, the bottom layer 1201 is a carbon based layer. In some embodiments, the middle layer 1202 is an oxide based layer. In some embodiments, the top layer 1203 is a photosensitive mask (e.g., photoresist).

As shown, the photoresist 1203 is patterned to include a gap 1205 aligned with a portion of a selected fin 106 for removal.

Figure 12:
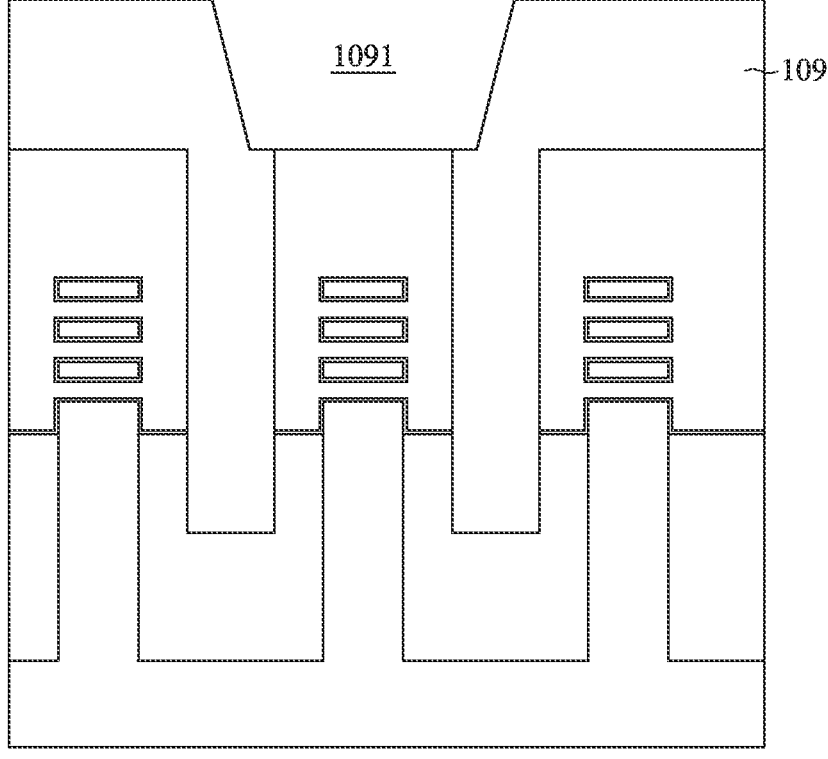
Figure 13:
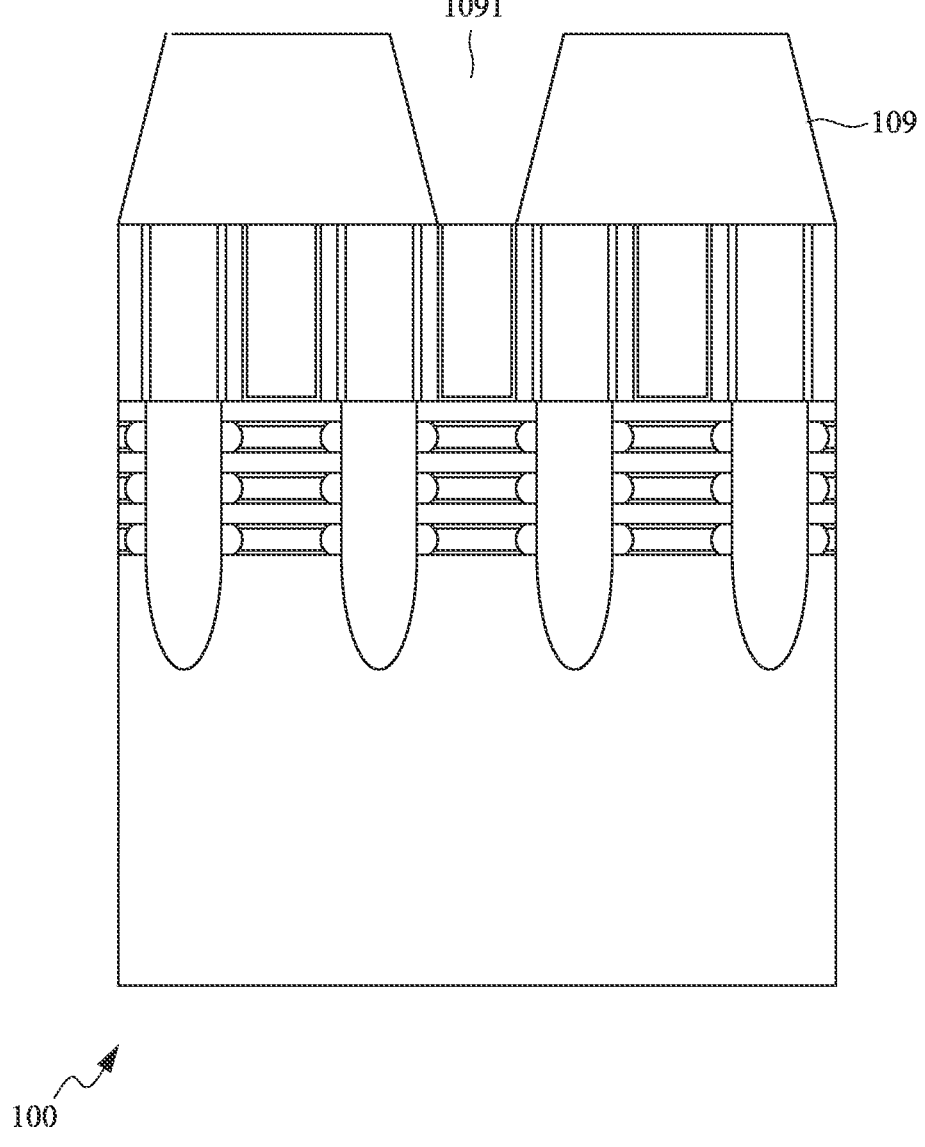

Cross-referencing FIG. 1 and FIGS. 12-13, method 10 may continue with a next step for forming a Continuous Poly On Diffusion Edge (CPODE) structure 111, in accordance with some embodiments. Specifically, at S19, method 10 etches the cut-metal structure/hard mask 109 through the gap 1205 to form openings 1091. Thereafter, the mask 1200 may be removed.

Figure 14:
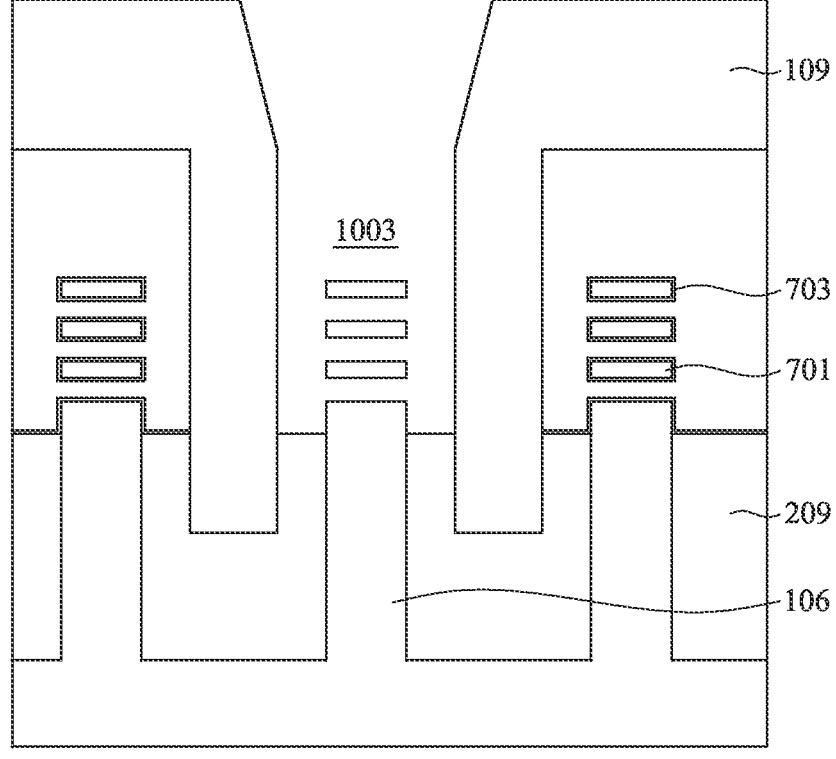
Figure 15:
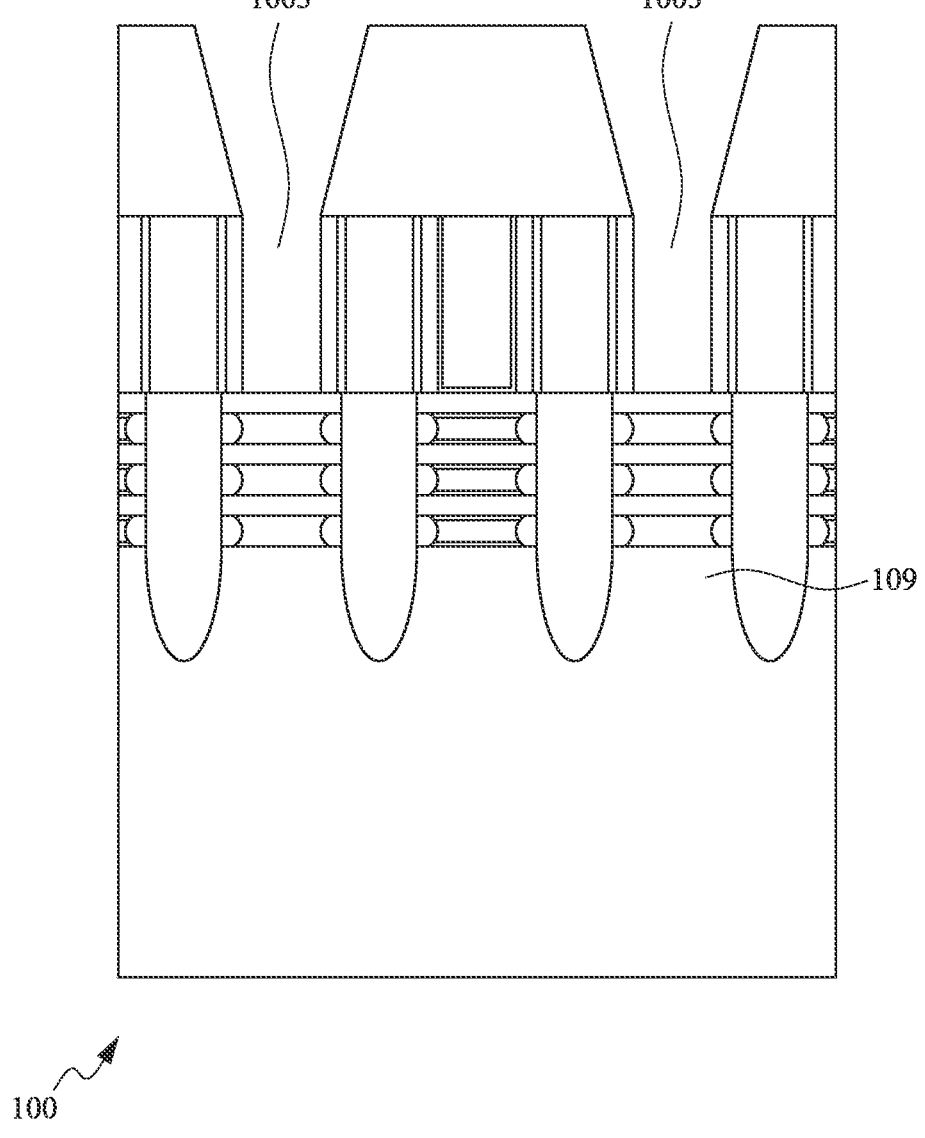

Cross-referencing FIG. 1 and FIGS. 14-15, method 10 may continue, at S20, with forming a void or opening 1003 over the portion of the fin structure 106 selected for removal. In exemplary embodiments, forming the opening 1003 includes selectively removing the section of the metal gate 107 lying over the selected fin structure 106. For example, the process may remove all of the metal gate 107 between the dielectric regions 109.

According to some embodiments, the etching process may stop on the gate dielectric 703. As a result, the gate dielectric 703 and the nanostructures 701 remain at the bottom of the opening 1003. According to some embodiments, the etching process used to form the opening 1003 may be an isotropic etching process (e.g., a wet etching process) using etchants that stop on the gate dielectric 703. However, other suitable etching process including anisotropic etching processes (e.g., a dry etching processes or reactive ion etching (RIE) processes), combinations of isotropic and anisotropic etches, or the like may also be used.

After the gate dielectric 703 has been exposed by forming the opening 1003, another etching process is performed to remove the materials of the gate dielectric 703 within the opening 1003 and to expose the nanostructures 701, the fin 106, and isolation regions 209 within the opening 1003. According to some embodiments, a wet etch, a dry etch, combinations, or the like may be used to remove the material of the gate dielectric 703. However, any suitable etching process may be used.

Figure 16:
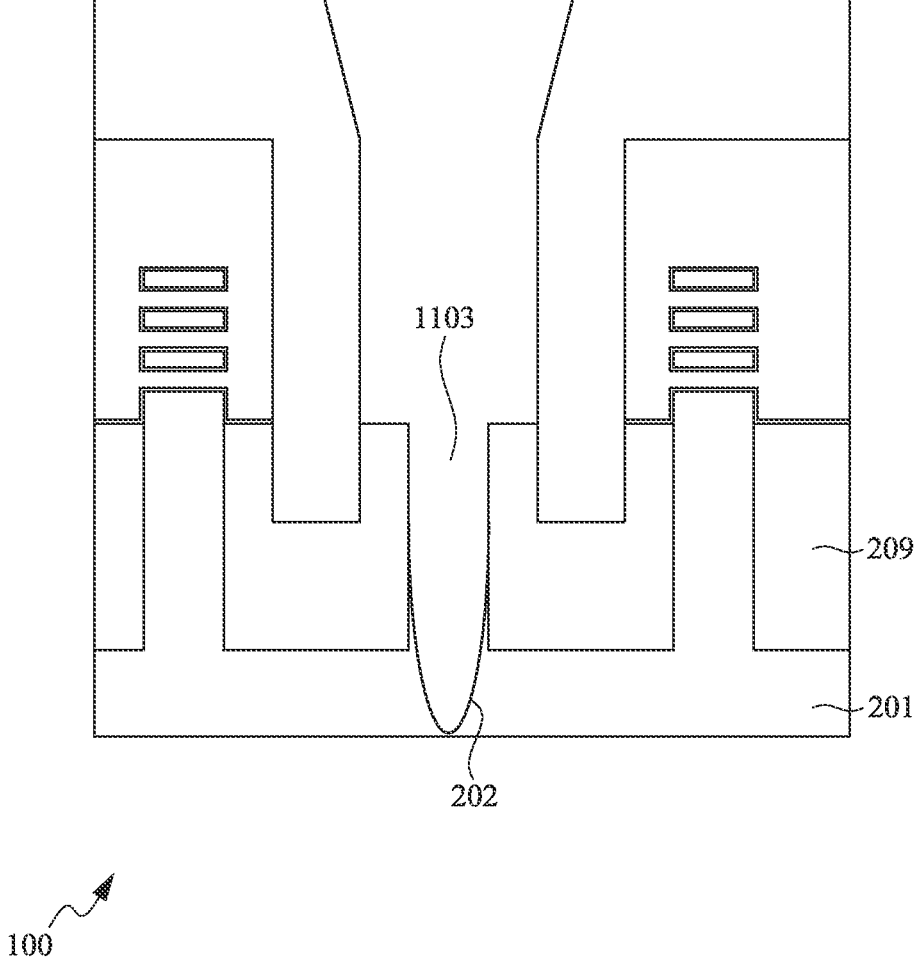
Figure 17:
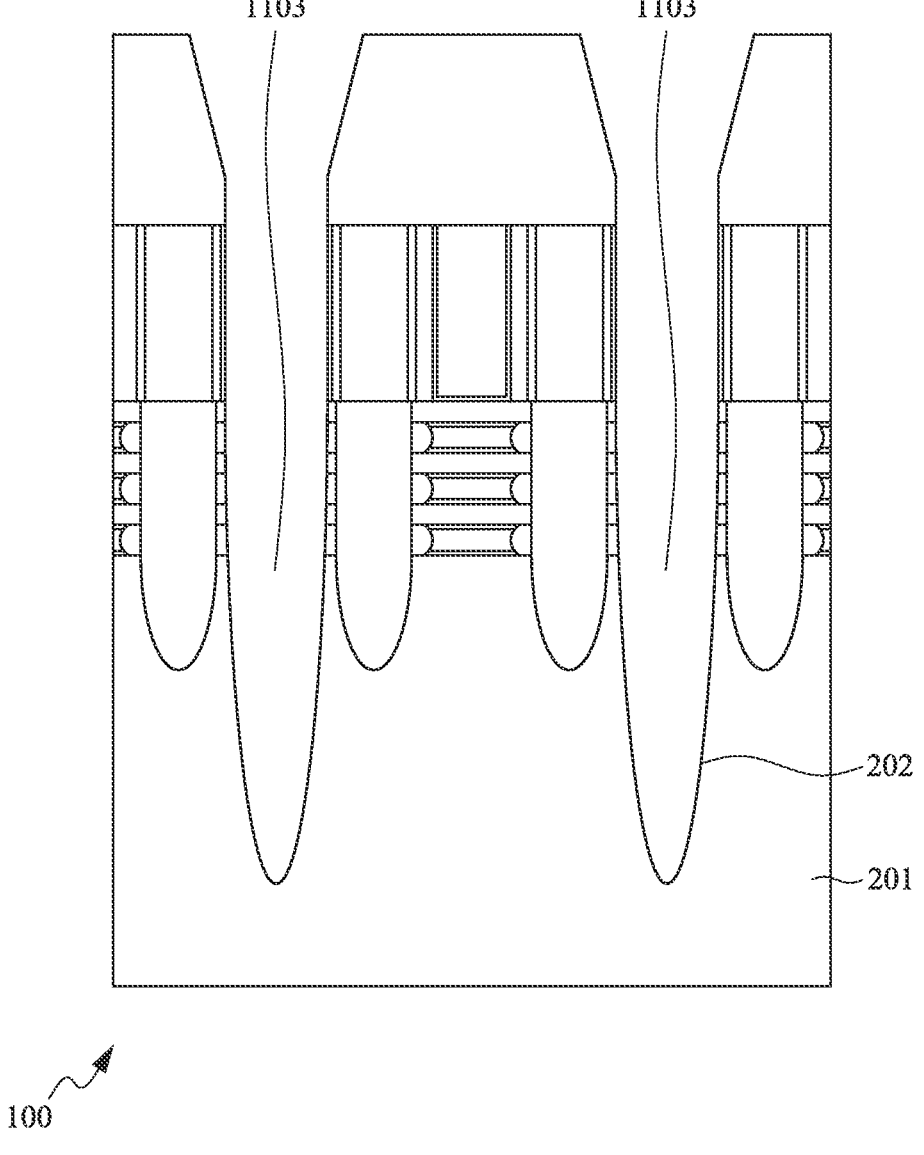

Cross-referencing FIG. 1 and FIGS. 16-17, method 10 may continue, at S19, with an intermediate step of performing the CPODE process including removing the nanostructures 701 and recessing the selected fin 106 to form trenches 1103. Specifically, after exposing the nanostructures 701 and a portion of the fin 106 protruding above the isolation regions 209, a further etching process may be used to remove the materials of the nanostructures 701 and to recess the fin 106. In exemplary embodiments, the fin 106 is removed, and a portion of the underlying substrate 201 is etched. As a result, an upper surface of the substrate 201 is recessed to a recessed surface 202. In exemplary embodiments, the etch process is a plasma etch as described below.

Figure 19:
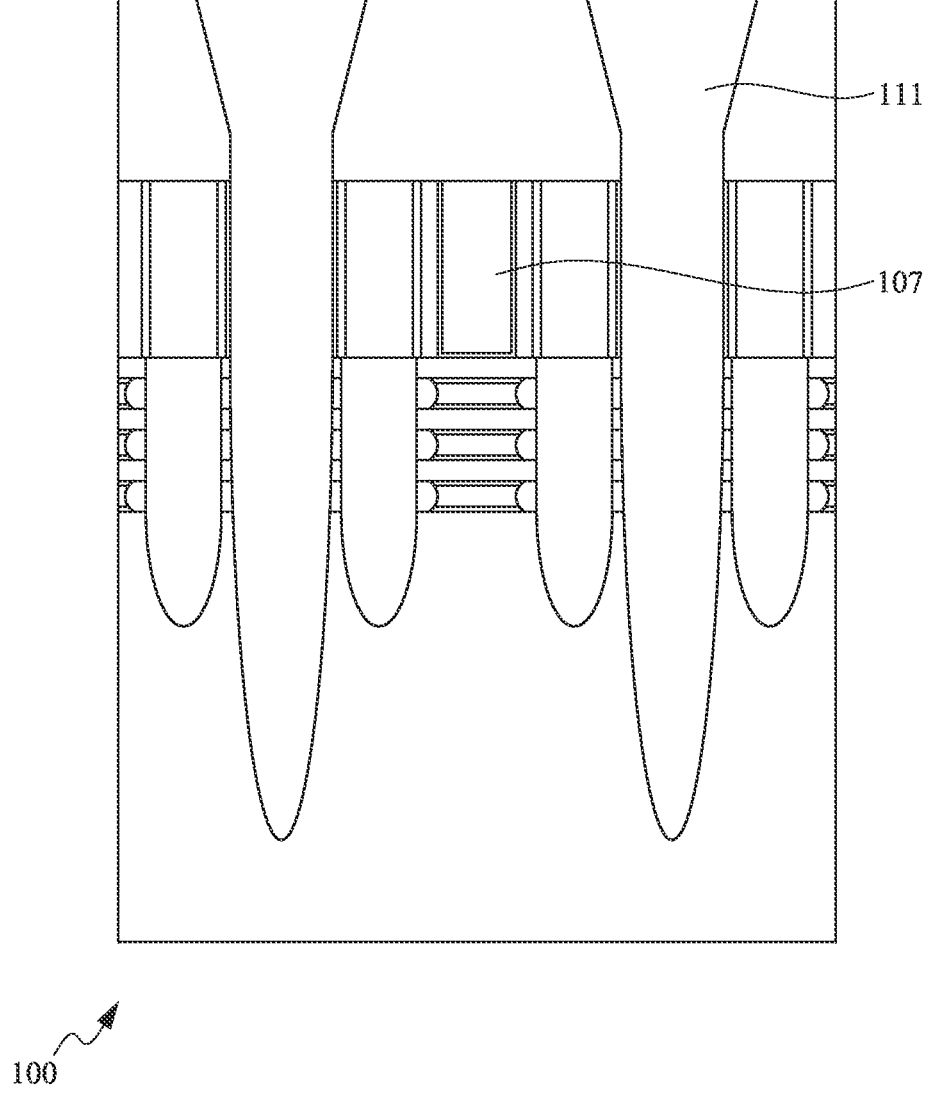

Cross-referencing FIG. 1 and FIGS. 18-19, method 10 may continue, at S22, with completing the CPODE process by forming the CPODE structure 111. For example, an insulator material or dielectric material may be deposited to fill and/or overfill the trenches 1103. The CPODE structure 111 or insulation region 111 may be formed using a dielectric material such as a silicon nitride (SiN), oxide (OX), silicon oxynitride (SiON), silicon oxycarbonitride (SiOCN), silicon carbonitride (SiCN), or the like. According to some embodiments, the CPODE structure 111 is formed using a metal oxide of materials such as zirconium (Zr), hafnium (Hf), aluminum (Al), or the like. Furthermore, the CPODE structure 111 may be formed using a suitable deposition process such as chemical vapor deposition (CVD), atomic layer deposition (ALD), physical vapor deposition (PVD), combinations of these, or the like. The CPODE structure 111 may be formed using any of the dielectric materials and processes suitable for forming the cut-metal gate structures 109. According to some embodiments, the dielectric material used to form the CPODE structure 111 is the same dielectric material used to form the cut-metal gate structures 109, although the dielectric materials may also be different. For example, in an embodiment where the cut-metal gate structures 109 are formed using silicon nitride (SiN), the CPODE structure 111 may be formed using silicon nitride (SiN) via a deposition process such as, chemical vapor deposition (CVD), atomic layer deposition (ALD), sputtering, or the like.

After depositing the dielectric material of the CPODE structure 111, the excess dielectric material outside of the opening 1003 may be removed by a chemical mechanical planarization (CMP) process. According to some embodiments, the chemical mechanical planarization (CMP) process may be continued to planarize the surfaces of the CPODE structure 111 with the gate electrode 107. After being planarized, the CPODE structure 111 over the fin 105 has a height of from about 55 nm to about 140 nm, such as about 70 nm. However, any suitable height may be used. The gate caps 801 have a height of from about 10 nm to about 30 nm, such as about 15 nm. However, any suitable height may be used. Furthermore, the cut-metal gate structures 109 have a height of from about 50 nm to about 120 nm, such as about 60 nm. However, any suitable height may be used.

As shown in FIG. 1, method 10 may continue, at S23, with further processing for completing the device 100. For example, the further processing may include forming interlayer dielectric and metallization layers, forming source/drain contacts to the source/drain regions, and forming source/drain vias and gate vias, in accordance with some embodiments.

Referring to FIGS. 20-22 and FIGS. 23-25, the plasma etching process of S21 is described in more detail.

Figure 20:
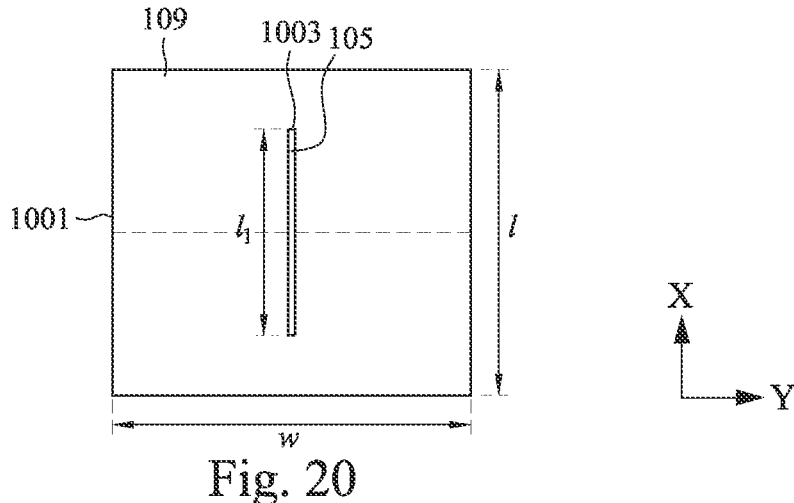
FIG. 20 is an overhead view of the partially fabricated device of FIG. 14 in an isolated region.

FIG. 20 is an overhead view of a portion of a selected fin structure 105 uncovered by the hard mask 109, such as in FIG. 14, in an isolated region 1001. In isolated region 1001, the fin structure 105 may be distanced from another fin structure in the Y-direction by a minimum distance of 500 nm, such as 1000 nm (1 micron), or 10,000 nm (10 microns). In other words, the pitch or spacing may be at least 500 nm, at least 1000 nm, or at least 10,000 nm. As shown in FIG. 20, the opening 1003 in the hard mask 109 around the selected portion of fin structure 105 has a length $l_1$ in the X-direction. In some embodiments, length $l_1$ is greater than or equal to 1000 nm (1 micron). Further, the isolated region 1001 has a length l in the X-direction and a width w in the Y-direction.

Figure 21:
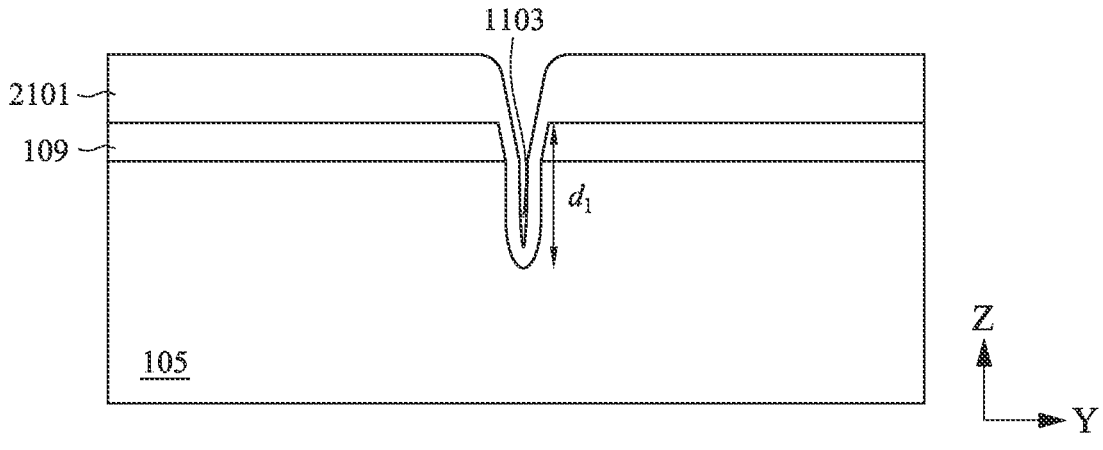
FIG. 21 is a cross-section view of the device of FIG. 20 along a Y-axis after a passivation-oriented etching operation.

FIG. 21 illustrates a passivation-oriented etching operation in the isolated region 1001. The passivation-oriented etching operation etches trench 1103 to a vertical depth $d_1$. As shown, the passivation-oriented etching operation forms a by-product 2101 on the hard mask 109 and in the trench 1103. For example, the by-product 2101 may be a polymer film.

For the passivation-oriented etching operation in the isolated region 1001, the total reactive area $A_1$ is equal to the width w×times the length l plus twice the depth $d_1$ times length $l_1$:

$$A_1 \approx (w \times l) + 2(d_1 \times l_1)$$

It has been found that, in isolated regions such as region 1001, passivation-oriented etching operations form trenches 1103 having relatively shallow vertical etch depths di.

Figure 22:
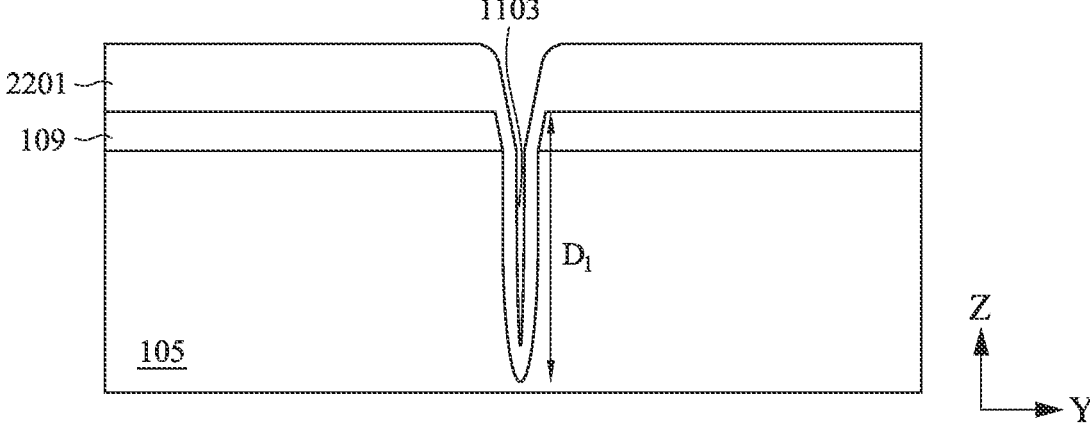
FIG. 22 is a cross-section view of the device of FIG. 20 along a Y-axis after an etchant-oriented etching operation.

FIG. 22 illustrates an etchant-oriented etching operation in the isolated region 1001. The etchant-oriented etching operation etches trench 1103 to a vertical depth $D_1$. As shown, the passivation-oriented etching operation forms a by-product 2201 on the hard mask 109 and in the trench 1103. For example, the by-product 2201 may be a polymer film.

It has been found that, in isolated regions such as region 1001, etchant-oriented etching operations form trenches 1103 having relatively deep vertical etch depths $D_1$. Cross-referencing FIGS. 21 and 22, it may be seen that vertical depth $D_1$ is greater than vertical depth $d_1$.

FIG. 23 is an overhead view of a portion of a selected fin structure 105 uncovered by the hard mask 109, such as in FIG. 14, in a dense region 1002. In dense region 1002, the fin structure 105 may be distanced from another fin structure in the Y-direction by a maximum distance of 100 nm, such as 60 nm or 50 nm. For example, the spacing or pitch may be no more than 100 nm, such as no more than 60 nm, or no more than 50 nm. As shown in FIG. 20, each opening 1003 in the hard mask 109 around a respective selected portion of fin structure 105 has a length $l_2$ in the X-direction. In some embodiments, length $l_2$ is greater than or equal to 1000 nm (1 micron). Further, the isolated region 1001 has a length l in the X-direction and a width w in the Y-direction.

FIG. 24 illustrates a passivation-oriented etching operation in the dense region 1002. The passivation-oriented etching operation etches trench 1103 to a vertical depth $d_2$. As shown, the passivation-oriented etching operation forms a by-product 2101 on the hard mask 109 and in the trench 1103. For example, the by-product 2101 may be a polymer film.

For the passivation-oriented etching operation in the dense region 1002, the total reactive area $A_2$ is equal to the width w times the length l plus n times twice the depth $d_2$ times length $l_2$, where n is the number of fin structures in the dense region:

$$A_2 \approx (w \times l) + n \times 2(d_2 \times l_2)$$

It has been found that, in dense regions such as region 1002, passivation-oriented etching operations form trenches 1103 having relatively deep vertical etch depths $d_2$.

FIG. 25 illustrates an etchant-oriented etching operation in the dense region 1002. The etchant-oriented etching operation etches trench 1103 to a vertical depth $D_2$. As shown, the passivation-oriented etching operation forms a by-product 2201 on the hard mask 109 and in the trench 1103. For example, the by-product 2201 may be a polymer film.

It has been found that, in dense regions such as region 1002, etchant-oriented etching operations form trenches 1103 having relatively shallow vertical etch depths $D_2$. Cross-referencing FIGS. 24 and 25, it may be seen that vertical depth $D_2$ is less than vertical depth $d_2$.

Thus, passivation-oriented etching operations form trenches 1103 having relatively deep vertical etch depths $d_2$ in dense regions 1002 and trenches 1103 having relatively shallow vertical etch depths $d_1$ in isolated regions 1001, while etchant-oriented etching operations form trenches 1103 having relatively shallow vertical etch depths $D_2$ in dense regions 1002 and trenches 1103 having relatively deep vertical etch depths $D_1$ in isolated regions 1001. Further, this phenomena is more prominent for longer patterns (longer lengths $l_1$ and $l_2$), as a result of the resulting larger reactive area $A_1$ and $A_2$. Also, this phenomena is more prominent when the lateral spacing difference between isolated regions 1001 and dense regions 1002 is greater.

As used herein, passivation-oriented etching operation refers to an etching operation with an etch rate that is limited and/or largely determined by passivation effects, and an etchant-oriented etching operation refers to an etching operation with an etch rate that is not limited by passivation effects.

In the passivation-oriented etching operation, a large amount of polymer and by-product are generated to passivate the sidewall of the trench. In some embodiments, the by-product is positive and the etching operation may still etch the semiconductor material. In some embodiments, the by-product is negative such that etching of the semiconductor material is stopped by the by-product.

The etching rate ER may be determined by the equation:

$$ER = \frac{1}{n} Y_{ion} \Gamma_{ion} \left( \frac{1}{1 + \dfrac{Y_{ion}\Gamma_{ion}}{S_{radical}\Gamma_{radical}}} \right) +$$

$$\frac{1}{n} Y_{high\ energy\ ion} \Gamma_{high\ energy\ ion} - \frac{1}{n} S_{polymer} \Gamma_{polymer} \pm \frac{1}{n} S_{byproduct} \Gamma_{byproduct}$$

wherein S: sticking coefficient Y: yield $\Gamma$: flux

Further, the desorption rate of the by-product may influence the etch rate. The following table presents the boiling point (B.P.) for by-products of selected etchants at 1 atm:

TABLE 1

| Etchant | Reaction Formula | By-Product Boiling Point (B.P.) | By-Product B.P. (Kelvin) | Type of polymer formed |
|---|---|---|---|---|
| $CF_4$ | $CF_4 + Si \rightarrow SiF_4 + C$ (polymer) | $SiF_4$ (−86° C.) | 187.15 K | CFSi based Polymer |
| $SF_6$ | $SF_6 + Si \rightarrow SiF_4 +$ SFSi (polymer) | $SiF_4$ (−86° C.) | 187.15 K | SFSi based polymer |
| $Cl_2$ | $Cl_2 + p\text{-Si} \rightarrow SiCl$ | $SiCl_4$ (57.65° C.) | 330.8 K | |
| $BCl_2$ | $BCl_3 + p\text{-Si} \rightarrow SiB_x +$ $SiCl_x$ | $SiCl_4$ (57.65° C.) | 330.8 K | $SiB_x$ based polymer |
| HBr | $HBr + Si \rightarrow SiBr_4 +$ H | $SiBr_4$ (153° C.) | 426.15 K | SiBr based polymer |

As shown in Table 1, the by-product desorption rate of $SiF_4$ is greater than the by-product desorption rate of $SiCl_4$, which is greater than the by-product desorption rate of $SiBr_4$. Therefore, HBr based etch operations lead to severe by-product accumulation, resulting passivation-oriented processes. On the other hand, Cl/F based etch operations lead to fast removal of by-products via desorption, resulting in etchant-oriented processes. It is noted that the pressure in the etch chamber may be much lower than 1 atm; however, it is expected that the trend of by-product desorption rate will remain the same.

In an embodiment, the passivation-oriented etching operation is performed with a hydrogen bromide (HBr) etchant, and the etchant-oriented etching operation is performed with a chlorine or fluorine based etchant.

Referring now to FIG. 26, a flow chart of a method 90 is provided. Method 90 includes at S91, determining a desired first depth of a first trench to be etched in a dense region of a substrate and a desired second depth of a second trench to be etched in an isolated region.

Also, method 90 may include, at S92, determining the desired length of the trenches to be formed.

At S93, method 90 includes determining the spacing of the dense region and the spacing of the isolated region.

Also, method 90 may include determining the width and length of the dense region and of the isolated region.

In view of the desired trench depths, desired trench lengths, spacing of the dense and isolated regions, and widths and lengths of the dense and isolated regions, method 90 may include, at S95, designing a plasma dry etch process to form the first trench with the desired first depth and the second trench with the desired second depth, wherein the plasma dry etch process includes a first plasma dry etch operation and a second plasma dry etch operation, wherein the first plasma dry etch operation has a first dense etch rate in dense regions and a first isolated etch rate in isolated regions, and wherein the second plasma dry etch operation has a second dense etch rate in dense regions and a second isolated etch rate in isolated regions. The design of the plasma dry etch process may include setting a duration for each first plasma dry etch operation and each second plasma dry etch operation, setting a number of cycles of the first plasma dry etch operation and the second plasma dry etch operation, and/or setting conditions of each iteration of the first plasma dry etch operation and each iteration of the second plasma dry etch operation.

At S96, method 90 includes performing the plasma etch process to form the first trench with the desired first depth and the second trench with the desired second depth. For example, a wafer including the dense region and the isolated region may be processed with a same plasma etch process to form the appropriate trenches in the dense region and in the isolated region, despite the different results obtained by certain operations across the dense region and the isolated region.

Performing the plasma etch process may include controlling the process as designed at S95.

Figure 27:
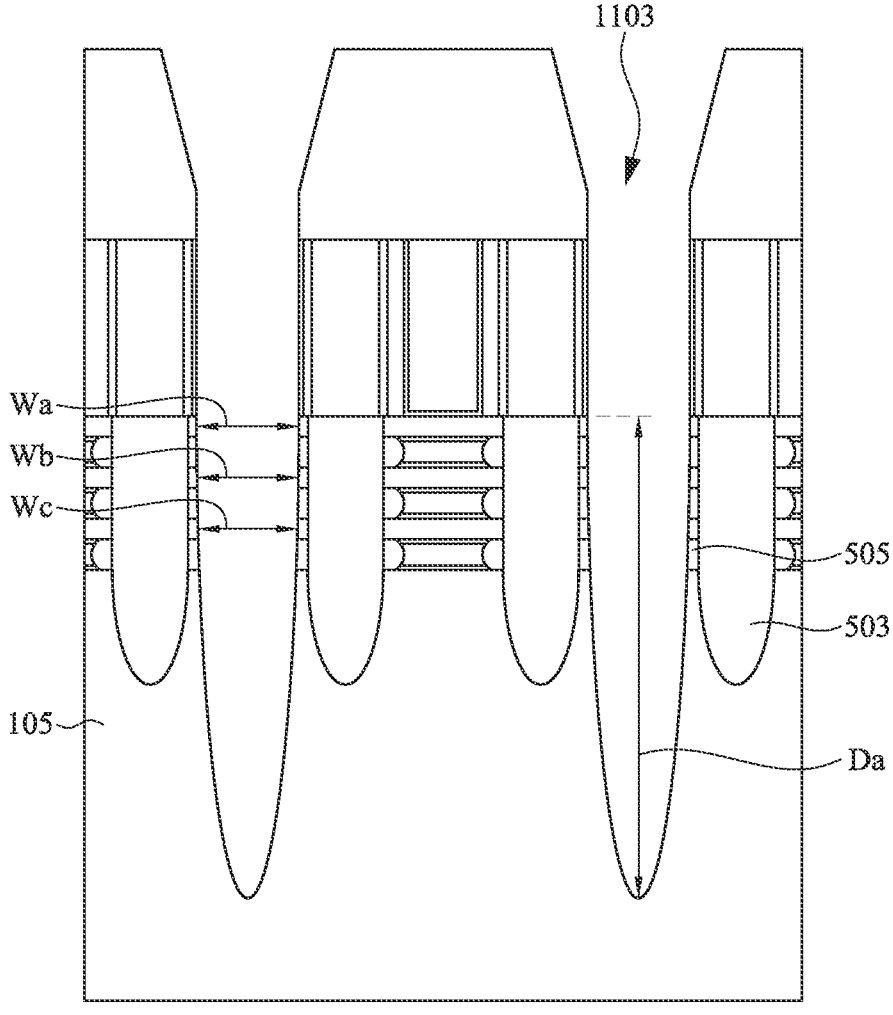
FIG. 27 is a cross-section view, similar to FIG. 17, provided for description of dimensions of the trench formed by operations of the plasma etching process.

FIG. 27 further illustrates various dimensions of a trench 1103 in which a CPODE structure 111 may be formed. As shown, the trench 1103 is formed such that inner spacers 505 remain located between the trenches 1103 and the epitaxial source/drain regions 503. Thus, damage to epitaxial source/drain regions 503 is avoided. In other words, the critical dimension or lateral width of the trenches 1103 are controlled carefully to avoid damage to the epitaxial source/drain regions 503. In FIG. 27, a lateral width Wa is defined at the uppermost nanosheet, a lateral width Wb is defined at the second nanosheet, and a lateral width We is defined at the lowest nanosheet. Further, the trench 1103 is formed with a depth Da measured from the top of the uppermost nanosheet.

In a dense region, the trench 1103 is formed by an etchant-oriented etching operation with an average uppermost nanosheet lateral width Wa of 16.3 nm, a maximum uppermost nanosheet lateral width Wa of 17.9 nm, and a minimum uppermost nanosheet lateral width Wa of 14.4 nm. In a dense region, the trench 1103 is formed by an etchant-oriented etching operation with an average second nanosheet lateral width Wb of 15.3 nm, a maximum second nanosheet lateral width Wb of 17.3 nm, and a minimum second nanosheet lateral width Wb of 13.9 nm. In a dense region, the trench 1103 is formed by an etchant-oriented etching operation with an average lowest nanosheet lateral width We of 15.5 nm, a maximum lowest nanosheet lateral width We of 17.6 nm, and a minimum lowest nanosheet lateral width We of 13.4 nm. In a dense region, the trench 1103 is formed by an etchant-oriented etching operation with an average depth Da of 147.6 nm, a maximum depth Da of 154.8 nm, and a minimum depth Da of 140.0 nm.

In an isolated region, the trench 1103 is formed by an etchant-oriented etching operation with an average uppermost nanosheet lateral width Wa of 18.4 nm, an average second nanosheet lateral width Wb of 14.6 nm, an average lowest nanosheet lateral width We of 14.9 nm, and an average depth Da of 178.9 nm.

In a dense region, the trench 1103 is formed by a passivation-oriented etching operation with an average uppermost nanosheet lateral width Wa of 17.3 nm, a maximum uppermost nanosheet lateral width Wa of 19.6 nm, and a minimum uppermost nanosheet lateral width Wa of 16.2 nm. In a dense region, the trench 1103 is formed by a passivation-oriented etching operation with an average second nanosheet lateral width Wb of 17.2 nm, a maximum second nanosheet lateral width Wb of 18.9 nm, and a minimum second nanosheet lateral width Wb of 15.3 nm. In a dense region, the trench 1103 is formed by a passivation-oriented etching operation with an average lowest nanosheet lateral width We of 22.3 nm, a maximum lowest nanosheet lateral width We of 25.8 nm, and a minimum lowest nanosheet lateral width We of 18.3 nm. In a dense region, the trench 1103 is formed by a passivation-oriented etching operation with an average depth Da of 136.0 nm, a maximum depth Da of 154.9 nm, and a minimum depth Da of 99.4 nm.

In an isolated region, the trench 1103 is formed by a passivation-oriented etching operation with an average uppermost nanosheet lateral width Wa of 20.8 nm, an average second nanosheet lateral width Wb of 19.0 nm, an average lowest nanosheet lateral width We of 19.0 nm, and an average depth Da of 114.3 nm.

In one embodiment, a method for fabricating a semiconductor device is provided and includes forming fins in a dense region and in an isolated region of a semiconductor substrate; performing a plasma etch process to remove a portion of at least one selected fin to form a first trench in the dense region and to remove a portion of at least one selected fin in the isolated region to form a second trench in the isolated region. The plasma etch process includes performing a passivation-oriented process and an etchant-oriented process; and controlling the passivation-oriented process and the etchant-oriented process to form the first trench with a desired first critical dimension and first depth and to form the second trench with a desired second critical dimension and second depth.

In some embodiments of the method, the passivation-oriented process etches with a bromide based etchant; and the etchant-oriented process etches with a chloride or fluoride based etchant.

In some embodiments of the method, the passivation-oriented process etches with a hydrogen bromide etchant;

and the etchant-oriented process etches with a carbon fluoride etchant, a silicon fluoride etchant, a chloride etchant, or a boron chloride etchant.

In some embodiments of the method, the passivation-oriented process forms a silicon bromide polymer; and the etchant-oriented process forms a fluoride, chloride, or boride polymer.

In some embodiments of the method, the passivation-oriented process forms a first by-product with a first boiling point; the etchant-oriented process forms a second by-product with a second boiling point; and the first boiling point is greater than the second boiling point.

In some embodiments of the method, the passivation-oriented process forms a first by-product with a first boiling point; the etchant-oriented process forms a second by-product with a second boiling point; and the first boiling point is greater than two times the second boiling point.

In some embodiments of the method, the passivation-oriented process forms a by-product on the selected fin at a first rate; the etchant-oriented process forms a by-product on the selected fin at a second rate; and the first rate is greater than the second rate.

In some embodiments of the method, the passivation-oriented process and the etchant-oriented process are controlled such that the first depth is greater than the second depth.

In some embodiments of the method, the passivation-oriented process and the etchant-oriented process are controlled such that the first depth is less than the second depth.

In some embodiments of the method, the passivation-oriented process and the etchant-oriented process are controlled such that the first critical dimension is greater than the second critical dimension.

In some embodiments of the method, the passivation-oriented process and the etchant-oriented process are controlled such that the first critical dimension is less than the second critical dimension.

In another embodiment, a method includes determining a desired first depth of a first trench to be etched in a dense region of a substrate and a desired second depth of a second trench to be etched in an isolated region; designing a plasma dry etch process to form the first trench with the desired first depth and the second trench with the desired second depth, wherein the plasma dry etch process includes a first plasma dry etch operation and a second plasma dry etch operation, wherein the first plasma dry etch operation has a first dense etch rate in dense regions and a first isolated etch rate in isolated regions, and wherein the second plasma dry etch operation has a second dense etch rate in dense regions and a second isolated etch rate in isolated regions; and performing the plasma etch process to form the first trench with the desired first depth and the second trench with the desired second depth.

In some embodiments of the method, the first plasma dry etch operation forms a first by-product with a first boiling point; the second plasma dry etch operation forms a second by-product with a second boiling point; and the first boiling point is greater than the second boiling point.

In some embodiments of the method, the desired first depth is greater than the desired second depth.

In some embodiments of the method, the desired first depth is less than the desired second depth.

In some embodiments of the method, the first plasma dry etch operation is a passivation-oriented process; and the second plasma dry etch operation is an etchant-oriented process.

In another embodiment, a method for etching a semiconductor material includes performing a passivation-oriented plasma dry etch operation; performing an etchant-oriented plasma dry etch operation; and repeating the first plasma etch operation and the second plasma dry etch operation to form a trench in the semiconductor material with a desired depth.

In some embodiments of the method, the passivation-oriented plasma dry etch operation etches with a bromide based etchant; and the etchant-oriented plasma dry etch operation etches with a chloride or fluoride based etchant.

In some embodiments of the method, the passivation-oriented plasma dry etch operation forms a silicon bromide polymer; and the etchant-oriented plasma dry etch operation forms a fluoride, chloride, or boride polymer.

In some embodiments of the method, the passivation-oriented plasma dry etch operation forms a first by-product with a first boiling point; the etchant-oriented plasma dry etch operation forms a second by-product with a second boiling point; and the first boiling point is greater than the second boiling point.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device comprising:

forming fins in a dense region and in an isolated region of a semiconductor substrate;

performing a plasma etch process to remove a portion of at least one selected fin to form a first trench in the dense region and to remove a portion of at least one selected fin in the isolated region to form a second trench in the isolated region, wherein the plasma etch process comprises:

performing a passivation-oriented process that forms a first by-product on sidewalls of the first and second trenches, wherein the passivation-oriented process has a first etch rate in the dense region that is greater than a second etch rate in the isolated region;

performing an etchant-oriented process that forms a second by-product on sidewalls of the first and second trenches, wherein the etchant-oriented process has a third etch rate in the dense region that is less than a fourth etch rate in the isolated region, and wherein the first by-product has a higher boiling point than the second by-product; and alternating between the passivation-oriented process and the etchant-oriented process multiple times, and controlling the passivation-oriented process and the etchant-oriented process to form the first trench with a desired first critical dimension and first depth and to form the second trench with a desired second critical dimension and second depth.

2. The method of claim 1, wherein:

the passivation-oriented process etches with a bromide based etchant; and the etchant-oriented process etches with a chloride or fluoride based etchant.

3. The method of claim 1, wherein:

the passivation-oriented process etches with a hydrogen bromide etchant; and the etchant-oriented process etches with a carbon fluoride etchant, a silicon fluoride etchant, a chloride etchant, or a boron chloride etchant.

4. The method of claim 1, wherein:

the passivation-oriented process forms a silicon bromide polymer; and the etchant-oriented process forms a fluoride, chloride, or boride polymer.

5. The method of claim 1, wherein:

the passivation-oriented process forms a first by-product with a first boiling point;

the etchant-oriented process forms a second by-product with a second boiling point; and the first boiling point is greater than the second boiling point.

6. The method of claim 1, wherein:

the dense region has a fin pitch of less than 100 nm and the isolated region has a fin pitch of greater than 500 nm; and the plasma etch process includes cyclically performing the passivation-oriented process and the etchant-oriented process.

7. The method of claim 1, wherein:

the passivation-oriented process forms the first by-product at a first rate;

the etchant-oriented process forms the second by-product at a second rate; and the first rate is greater than the second rate.

8. The method of claim 1, wherein the passivation-oriented process and the etchant-oriented process are controlled such that the first depth is greater than the second depth.

9. The method of claim 1, wherein the passivation-oriented process and the etchant-oriented process are controlled such that the first depth is less than the second depth.

10. The method of claim 1, wherein the passivation-oriented process and the etchant-oriented process are controlled such that the desired first critical dimension is greater than the desired second critical dimension.

11. The method of claim 1, wherein the passivation-oriented process and the etchant-oriented process are controlled such that the desired first critical dimension is less than the desired second critical dimension.

12. A method comprising:

determining a desired first depth of a first trench to be etched in a dense region of a substrate and a desired second depth of a second trench to be etched in an isolated region;

designing a plasma dry etch process to form the first trench with the desired first depth and the second trench with the desired second depth, wherein the plasma dry etch process includes alternating between a first plasma dry etch operation and a second plasma dry etch operation, wherein the first plasma dry etch operation has a first dense etch rate in dense regions and a first isolated etch rate in isolated regions, wherein the first dense etch rate is greater than the first isolated etch rate, wherein the second plasma dry etch operation has a second dense etch rate in dense regions and a second isolated etch rate in isolated regions, and wherein the second dense etch rate is less than the second isolated etch rate; and performing the plasma dry etch process by alternating between the first plasma dry etch operation and the second plasma dry etch operation to form the first trench with the desired first depth and the second trench with the desired second depth.

13. The method of claim 12 wherein:

the first plasma dry etch operation forms a first by-product with a first boiling point;

the second plasma dry etch operation forms a second by-product with a second boiling point; and the first boiling point is greater than the second boiling point.

14. The method of claim 12 wherein the desired first depth is greater than the desired second depth.

15. The method of claim 12, wherein the desired first depth is less than the desired second depth.

16. The method of claim 12, wherein:

the first plasma dry etch operation is a passivation-oriented process; and the second plasma dry etch operation is an etchant-oriented process.

17. A method for etching a semiconductor material, the method comprising:

performing a sequence of etching operations comprising:

performing a passivation-oriented plasma dry etch operation for a first duration, wherein the passivation-oriented plasma dry etch operation forms a first by-product with a first boiling point; and performing an etchant-oriented plasma dry etch operation for a second duration, wherein the etchant-oriented plasma dry etch operation forms a second by-product with a second boiling point, wherein the first boiling point is greater than the second boiling point; and repeating the sequence of etching operations at least once to form a trench in the semiconductor material with a desired depth.

18. The method of claim 17, wherein:

the passivation-oriented plasma dry etch operation etches with a bromide based etchant;

the passivation-oriented plasma dry etch operation forms a silicon bromide polymer as the first byproduct;

the etchant-oriented plasma dry etch operation etches with a chloride or fluoride based etchant; and the etchant-oriented plasma dry etch operation forms a fluoride, chloride, or boride polymer as the second byproduct.

19. The method of claim 17, further comprising controlling the passivation-oriented plasma dry etch operation and the etchant-oriented plasma dry etch operation by adjusting at least one of the first duration or the second duration to form the trench with a desired critical dimension.

20. The method of claim 17, wherein the first boiling point is greater than two times the second boiling point.

* * * * *